United States Patent
Ausschnitt et al.

(10) Patent No.: US 10,656,535 B2
(45) Date of Patent: May 19, 2020

(54) METROLOGY METHOD FOR A SEMICONDUCTOR MANUFACTURING PROCESS

(71) Applicant: IMEC VZW, Leuven (BE)

(72) Inventors: Christopher Ausschnitt, Heverlee (BE); Vincent Truffert, Woluwe Saint Pierre (BE)

(73) Assignee: IMEC VZW, Leuven (BE)

( * ) Notice: Subject to any disclaimer, the term of this patent is extended or adjusted under 35 U.S.C. 154(b) by 257 days.

(21) Appl. No.: 15/938,002

(22) Filed: Mar. 28, 2018

(65) Prior Publication Data

US 2018/0284624 A1 Oct. 4, 2018

(30) Foreign Application Priority Data

Mar. 31, 2017 (EP) .................................... 17164341
Mar. 31, 2017 (EP) .................................... 17164371
Sep. 15, 2017 (EP) .................................... 17191242

(51) Int. Cl.
*G03F 7/20* (2006.01)

(52) U.S. Cl.
CPC .......... *G03F 7/70641* (2013.01); *G03F 7/705* (2013.01); *G03F 7/70608* (2013.01); *G03F 7/70625* (2013.01)

(58) Field of Classification Search
CPC .. G03F 7/70641; G03F 7/705; G03F 7/70608; G03F 7/70625

USPC ........................................................... 430/30
See application file for complete search history.

(56) References Cited

U.S. PATENT DOCUMENTS 10,481,504 B2 * 11/2019 Ausschnitt .............. G03F 7/705

* cited by examiner

*Primary Examiner* — Christopher G Young
(74) *Attorney, Agent, or Firm* — McDonnell Boehnen Hulbert & Berghoff LLP

(57) ABSTRACT

A method and apparatus is disclosed for monitoring critical dimensions in a pattern of 1-dimensional and/or 2-dimensional features, produced on a substrate in a process step that is part of or related to a manufacturing process for producing a semiconductor device, the process step being performed in accordance with a predefined pattern design, wherein one or more metrology targets (1) are added to the pattern design. The targets comprise one or more versions of an asymmetric metrology mark, each version of the mark comprising a uniform portion (2) and a periodic portion (3), the latter comprising a regular array of parallel line-shaped features or an array of 2-dimensional features. The design width of the features is situated in a range situated around a nominal design width w0. A position-related parameter S is defined that is essentially proportional to the design widths in the range. Determination of the shift δS of the S parameter with respect to a pre-defined process operating point, allows to assess the critical dimension of the features produced by the process step.

20 Claims, 23 Drawing Sheets

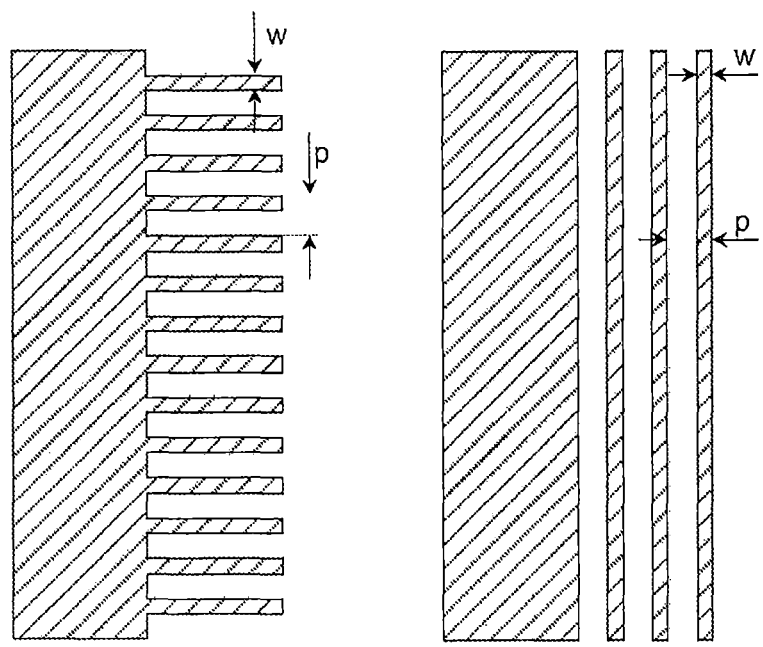
FIG. 1A  FIG. 1B
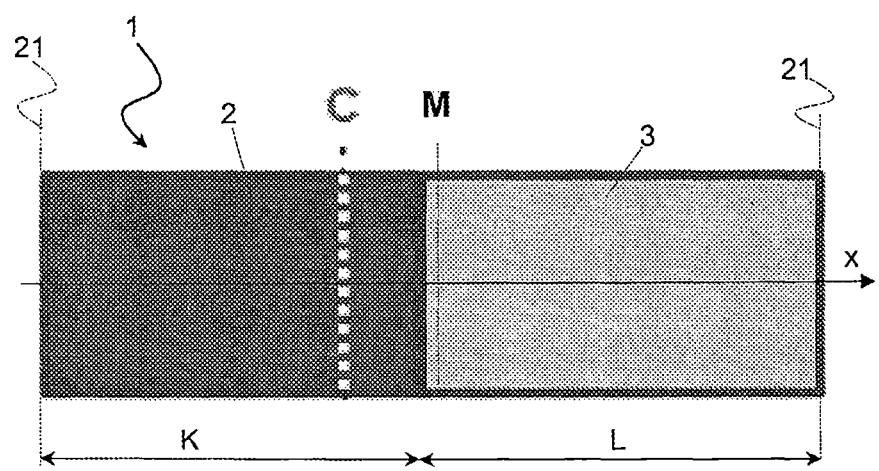
FIG. 2

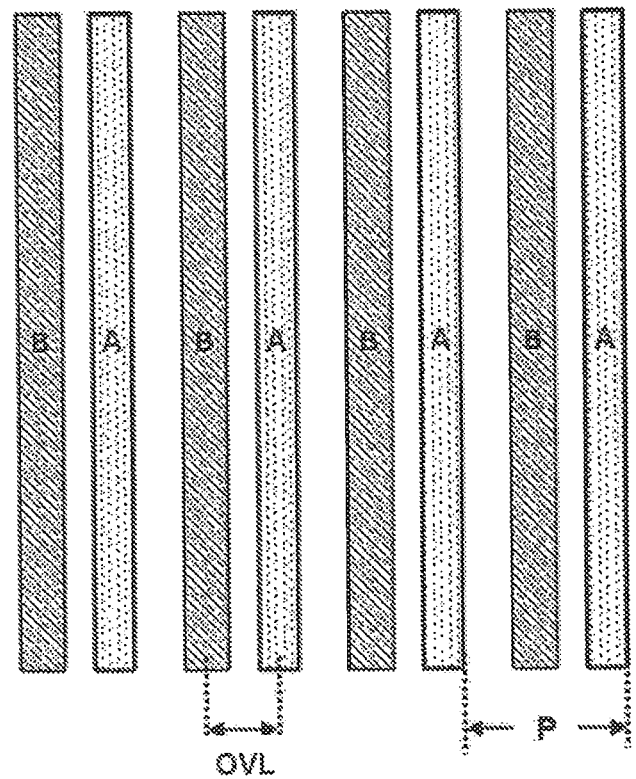
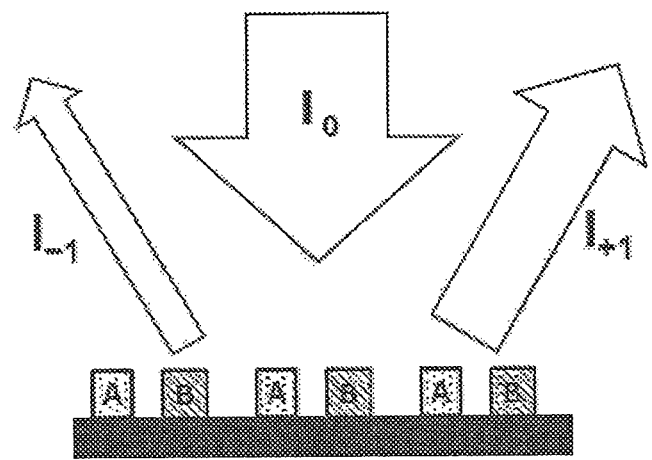
FIG. 13 (Prior Art)

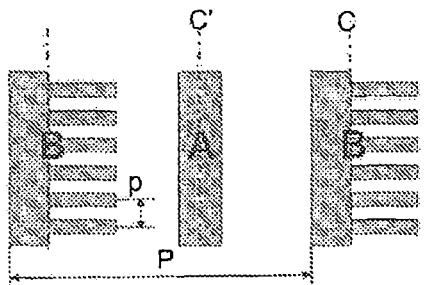
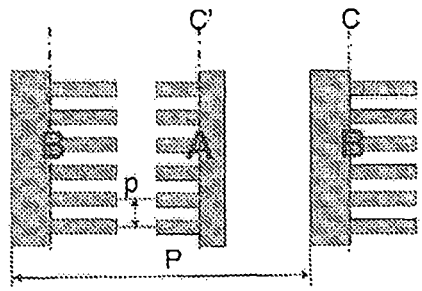
FIG. 14A  FIG. 14B
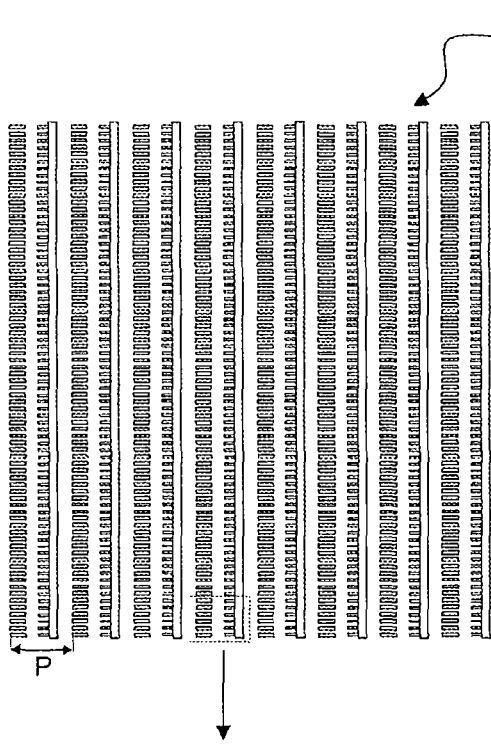
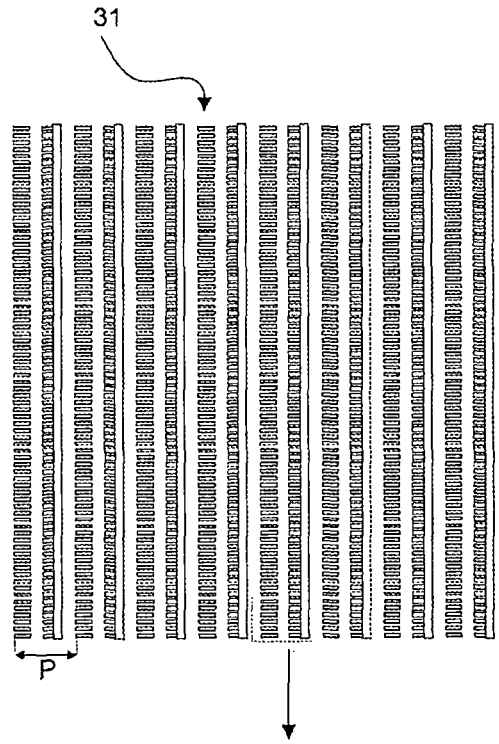
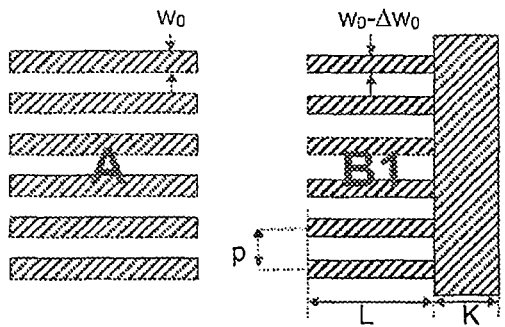
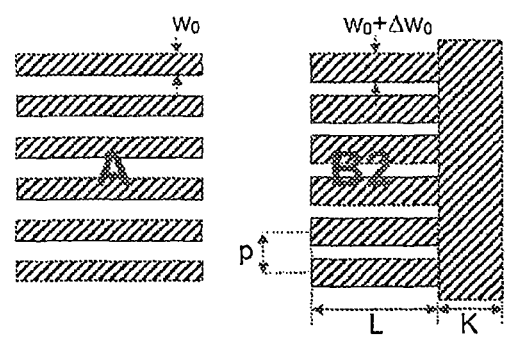
FIG. 15A

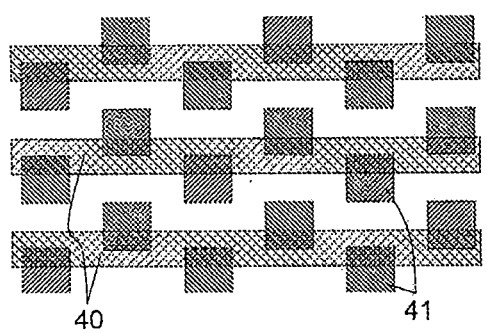
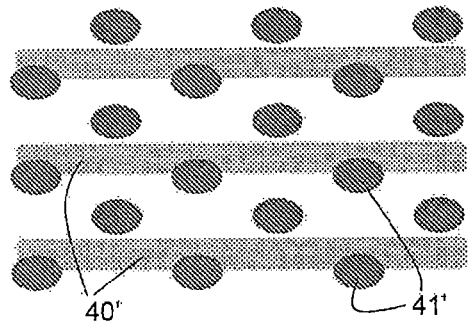
FIG. 19A  FIG. 19B
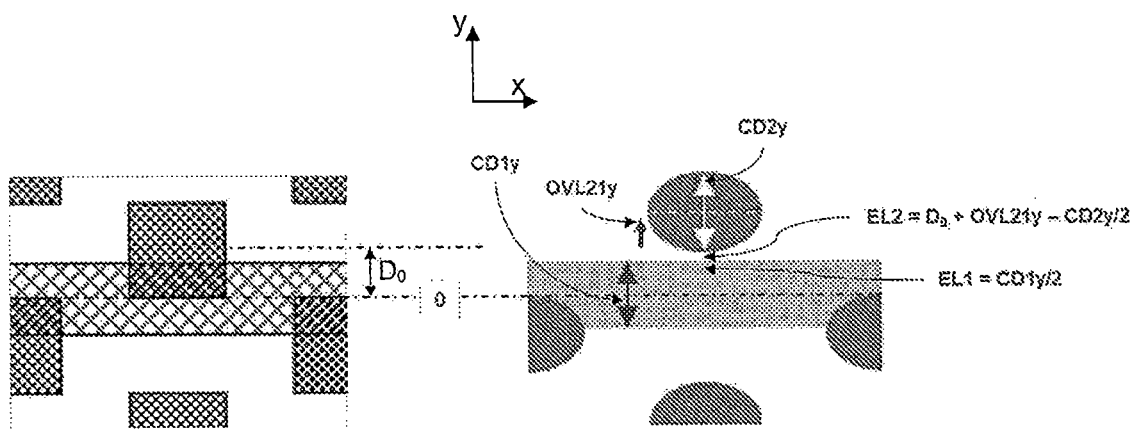
FIG. 20A  FIG. 20B

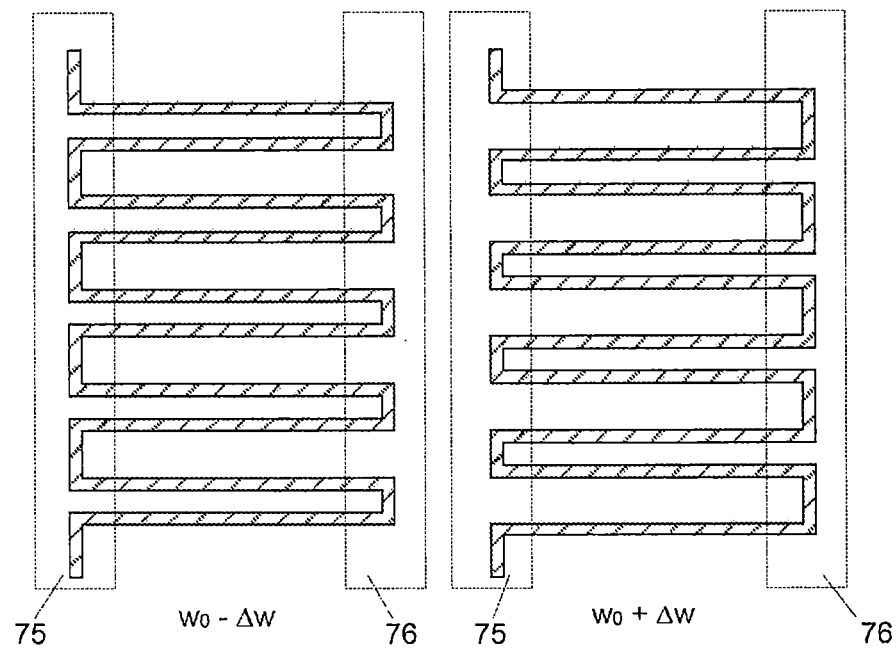
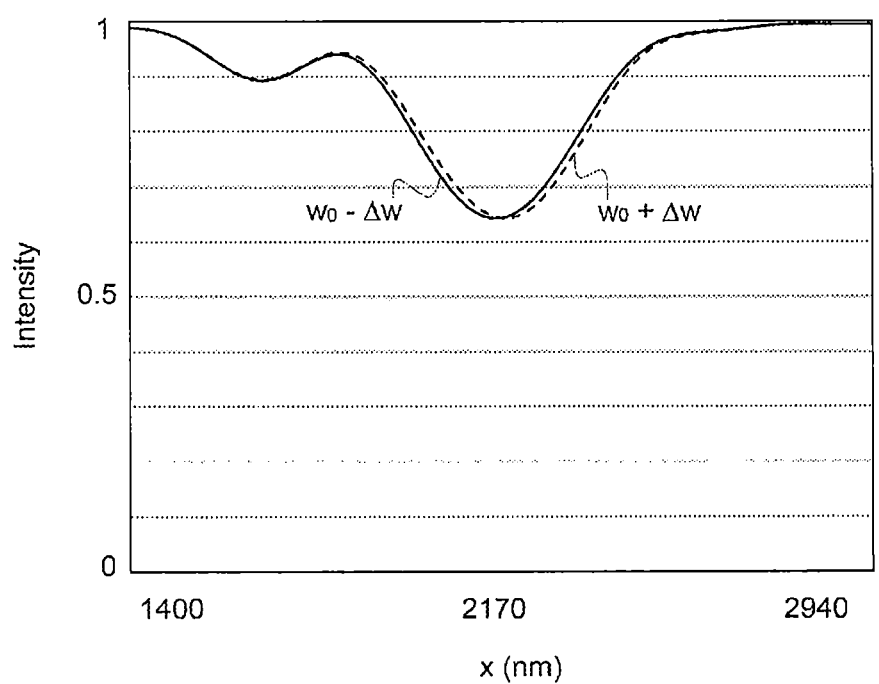
FIG. 27

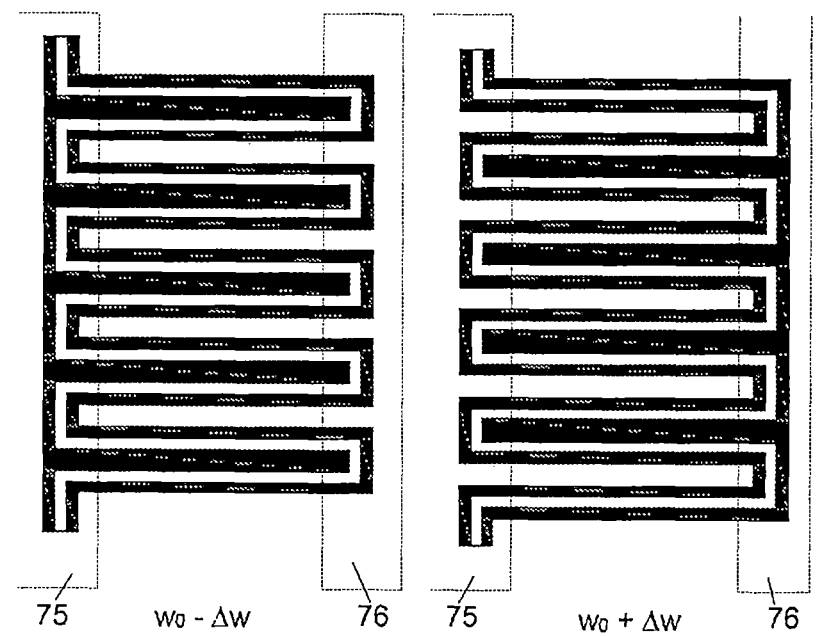
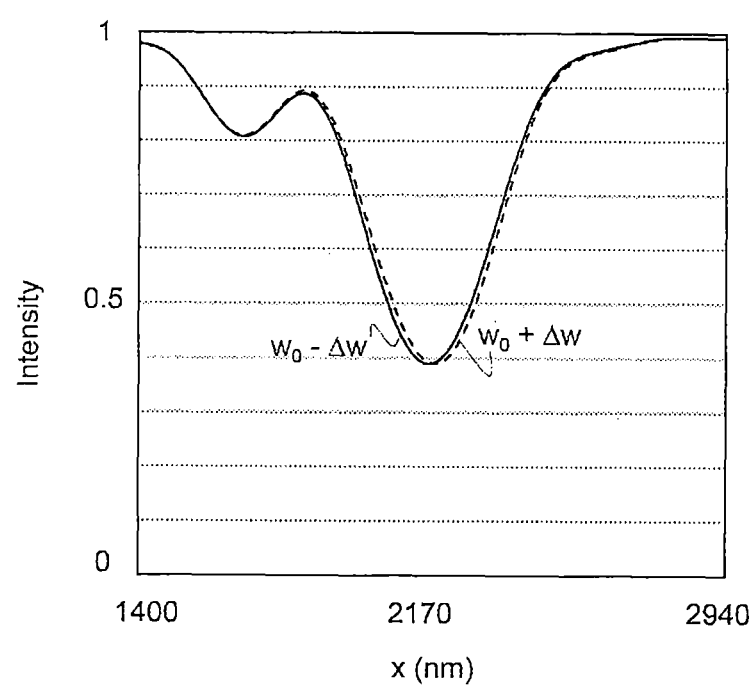
FIG. 28

METROLOGY METHOD FOR A SEMICONDUCTOR MANUFACTURING PROCESS

CROSS-REFERENCE TO RELATED APPLICATIONS

The present application is a non-provisional patent application claiming priority to European Provisional Patent Application No. EP 17191242.1, filed Sep. 15, 2017; European Provisional Patent Application No. EP 17164341.4, filed Mar. 31, 2017; and European Provisional Patent Application No. EP 17164371.1, filed Mar. 31, 2017, the contents of each of which are hereby incorporated by reference.

FIELD OF THE DISCLOSURE

The present disclosure is related to semiconductor processing, in particular to a metrology method for monitoring lithographic and/or etch processes during the fabrication of a semiconductor chip.

BACKGROUND

Semiconductor processing includes many patterning steps, wherein a device design is first transferred to a lithographic mask and the mask is exposed to a light source, resulting in the printing of the pattern on a photoresist film deposited on a layer stack that is built up layer by layer on a semiconductor wafer. After development of the resist, etching transfers the pattern to a layer of the stack, for example for realizing a metal conductor pattern in a level of the back-end-of-line stack of an integrated circuit chip. Subsequent processing may also include additional deposition, etch and polish steps to further modify the pattern, such as in self-aligned multiple patterning. Feature dimensions of the patterns in present day processing technology are of the order of nanometers, and the monitoring of the features includes specific metrology tools. The main dimension of interest is referred to as the critical dimension (CD) of rectilinear features of physical patterns at each of the various processing steps.

Current methods for measuring CD variation have significant drawbacks: (a) High resolution methods such as Scanning Electron Microscopy (SEM) or Atomic Force Microscopy (AFM) are relatively slow, expensive, and potentially destructive (particularly to resist patterns). Current optical methods (e.g., scatterometry) include model development for each pattern and process configuration, are difficult to calibrate and susceptible to variation in underlying film stacks. There may be a need therefore for alternative methods that allow a reliable and non-intrusive way of verifying the critical dimensions of printed and/or etched pattern features.

Self-aligned multi-patterning SAxP is a method essential to semiconductor density scaling. It is a technique of multiplying, typically doubling (SADP) or quadrupling (SAQP), the spatial periodicity of regular arrays by the formation of sidewall spacers on a periodic mandrel (aka, core) structure. To achieve uniform periodicity in the final array, the width dimension of the mandrel elements might be controlled relative to their pitch and to the spacer width. In the SAQP example, the mandrel pitch may be 128 nm, the width of the spacer 16 nm, so that the mandrel element width might be controlled at 48 nm to result in an SAQP pitch of 32 nm. A variation of the mandrel width results in a variation of the nominal 32 nm pitch across the array, known as "pitch walking." Pitch walking is a significant failure mechanism in semiconductor manufacturing. Current methods of pitch walking metrology and control are slow, expensive and error-prone.

SUMMARY

The disclosure is related to a method as disclosed in the appended claims. A method and apparatus is disclosed for monitoring critical dimensions in patterns produced on a substrate in a process step that is part of or related to a manufacturing process for producing a semiconductor device, such as an integrated circuit chip, the process step being performed in accordance with a predefined pattern design, wherein one or more metrology targets are added to the pattern design. The targets may for example be embedded in or on the periphery of the active device area of a lithographic mask used in a chip manufacturing process, or the targets may be added to test patterns produced on a test wafer in a tool or process qualification and calibration sequence. The term "pattern design" is therefore not to be understood as referring only to device designs applied in chip manufacturing. Some embodiments find an important application in such manufacturing processes but also in related processes, such as the above-described qualification/calibration, and the production of lithographic masks.

Each target included in the pattern design comprises one or more versions of an asymmetric metrology mark, each version of the mark comprising a uniform portion and a periodic portion, the latter comprising a regular array of parallel 1-dimensional features, i.e. line-shaped features or a regular array of 2-dimensional features, i.e. an array of squares or rectangles. According to an embodiment, the design dimensions of the features, for example the design width w of line features are distributed across a range situated around and including a nominal value $w_0$ that corresponds to a critical dimension of the features produced in the manufacturing process. From the detected position of the centroids of the mark patterns, a position-related parameter S is derived that is essentially proportional to the design dimensions in the range. According to example embodiments, the shift $\delta S$ of this parameter is determined with respect to a process operating point previously determined during setup and calibration of the production process. According to embodiments of the method, the proportionality factor of the relation between S and the design dimension may also be determined, as well as the shift $\delta CD$ of the critical dimensions of features printed in the fabrication process, with respect to a reference value $CD_p$ measured at the process operating point. The asymmetric mark design enables proportionality factors>>1; i.e., amplification of response of S to $\delta CD$ such that $\delta S >> \delta CD$ and the effective precision of CD determination is much better than the intrinsic precision of the measurement itself.

The disclosure is more particularly related to a method for monitoring the critical dimensions of rectilinear features, i.e. 1-dimensional features, and/or 2-dimensional features, arranged in a pattern and produced on a substrate by a process step that is part of or related to a manufacturing process for producing a semiconductor device, the process step being performed in accordance with a predefined pattern design, wherein one or more metrology targets are added to the pattern design, each target comprising one or more marks of an asymmetric design, each mark comprising a uniform portion of width K and a periodic portion of width L arranged adjacently in a given direction, the periodic portion comprising 1-dimensional or 2-dimensional features arranged in a regular array, wherein the periodic portion comprises an array of 1-dimensional features at a design pitch (p) and design dimension equal to and/or situated in a range around a nominal value ($w_0$) or 2-dimensional features at design pitches ($p_a$, $p_b$) and design dimensions equal to and/or situated in a range around nominal values ($w_{0_a}$, $w_{0_b}$). In other words, the periodic portion may include an array of 1-dimensional features or 2-dimensional features at a design pitch (p; $p_a$, $p_b$), wherein the design dimension of the 1-dimensional features or one of the design dimensions of the 2-dimensional features is equal to and/or situated in a range around a nominal value ($w_0$). The nominal value $w_0$ may thus be the nominal value of the width of the 1-dimensional features, or it may be the nominal value of the width in one or the other dimension, of the 2-dimensional features.

The method comprises the following steps, performed in relation to each of the one or more targets:

Performing the process step, thereby obtaining one or more asymmetric mark patterns corresponding respectively to the one or more asymmetric marks. The term "corresponding to" means that the mark patterns are reproductions of the marks.

Defining a parameter S representative of the position of the centroid of the mark patterns, wherein the parameter S changes essentially linearly as a function of at least one of the design dimensions w of the of the 1-dimensional or 2-dimensional features, i.e. dS/dw=α with α a proportionality factor, determining from the mark patterns the shift δS of the S-parameter for an asymmetric mark having features of design dimension $w_0$ with respect to a reference value for the S-parameter, the reference value being valid at a previously defined process operating point for the process step, Assessing on the basis of δS the critical dimension of 1-dimensional and/or 2-dimensional features of the one or more mark patterns produced by the process step.

According to an embodiment, the method comprises for each target:

determining the proportionality factor α,

Calculating $δw_0=δS/α$,

Evaluating $δw_0$ with respect to a tolerance.

The method may further comprise the step of evaluating $|α-α_0|$ with respect to a tolerance, wherein $α_0$ is the value for α at the process operating point.

According to an embodiment:

one or more of the targets comprises asymmetric marks configured so that the position of the centroid of the asymmetric mark patterns is detectable by an optical tool, so that the parameter S can be measured with the help of the tool, the one or more targets comprise a plurality of the asymmetric marks, having the one or more design dimensions in a range around the nominal value $w_0$, and possibly including a mark having the design dimensions equal to the nominal value $w_0$, for each of the one or more targets:
the parameter α is determined by fitting a linear function to the measured values of the S-parameter for the plurality of marks,
δS is determined as $S_0-S_{0ref}$, wherein:
$S_0$ is the parameter value for a mark pattern of a mark having features of the nominal design dimension,
$S_{0ref}$ is the reference value for the S-parameter at the process operating point.

According to an embodiment, the one or more asymmetric marks are arranged in each of the one or more targets as mirrored pairs of identical marks, mirrored about a line perpendicular to the direction in which the uniform and periodic portion are arranged, and wherein the position-representative parameter S is a function of the distance D between the centroids of the two mirrored mark patterns representative of the two mirrored marks.

According to an embodiment, the one or more asymmetric marks are arranged in each of the one or more targets with respect to one or more symmetric marks, and wherein the position-representative parameter S is a function of the distance D between the centroid of the asymmetric mark patterns representative of the one or more asymmetric marks and the centroid of the symmetric mark pattern or patterns representative of or derived from the one or more symmetric marks.

According to an embodiment, the position representative parameter S is equal to $D-D_s$, with $D_s$ the design value of the distance between the geometric midpoints of two mirrored marks, wherein $D_s$ is a constant for each of the plurality of design widths ($w_0$, $w_{-1}$, $w_{+1}$, etc.) and for the given direction.

According to an embodiment:

one or more of the targets comprises at least a first and a second set of diffraction gratings, each set being formed of two grating marks arranged adjacently in the same direction and in a repeated manner, at least one of the grating marks in each set being an asymmetric mark as defined in the preceding claims, the asymmetric mark of the first grating set comprising features of design dimension $w_0-Δw_0$, wherein $Δw_0$ is a predefined offset value, the asymmetric mark of the second grating set comprises features of design dimension $w_0+Δw_0$, δS and α are calculated from the equations:

$$α=(ΔI_1-ΔI_2)/2κΔw_0$$

$$δS=(ΔI_1+ΔI_2)/2κ$$

wherein:

$ΔI_1$ and $ΔI_2$ are the differences between the plus and minus first order diffracted intensity measured on the first and second set of mark features obtained by the lithography step or the etch step, on the basis of the first and second grating set, κ is a diffraction factor.

According to an embodiment, κ is calculated from a measurement of the plus and minus diffraction intensities of an additional set of two gratings located within or in the vicinity of the pattern design, each grating set formed of two marks arranged adjacently and in a repeated manner, at least one of the marks being an asymmetric mark, and wherein the distance between two adjacent marks A' and B' is different in the first grating compared to the second grating, the difference between the distances being pre-defined.

The method may further comprise for each target and for at least one of the dimensions:

Calculating from δS the shift δCD of the critical dimension CD of features of the nominal design dimension $w_0$, with respect to the value of the critical dimension $CD_p$ at the process operating point, and wherein δCD is calculated as $β·δw_0$, wherein β is a proportionality factor that expresses a linear relation between CD and the design dimension of the features, i.e. dCD/dw=β, evaluating δCD with respect to a tolerance.

According to an embodiment, the factor β is calculated as (α/G) wherein G is proportional to L/p, with L the width in the direction of asymmetry of the periodic portion of the mark pattern or patterns and p the nominal pitch of the line features of the periodic portion.

The method may further comprise the step of evaluating $|\beta-1|$ with respect to a tolerance.

According to an embodiment, one or more of the targets comprises one or more asymmetric marks configured so that the position of the centroid of the asymmetric mark patterns is detectable by an optical tool, so that the parameter S can be measured with the help of the tool, and wherein at least one target comprises a mark having at least one of the design dimensions equal to the nominal value, and wherein the method further comprises the steps of:

Calculating from $\delta S$ the shift $\delta CD$ of the critical dimension CD of features of the nominal design dimension $w_0$, with respect to the value of the critical dimension $CD_p$ at the process operating point, and wherein $\delta CD$ is calculated as $\delta S/G$, wherein G is proportional to L/p with L the width of the periodic portion of the mark and p the pitch of the array of features in the direction of the dimension, evaluating $\delta CD$ with respect to a tolerance.

According to an embodiment, the one or more asymmetric marks in at least one of the targets are comb-shaped marks, wherein the periodic portion comprises an array of parallel features extending in the direction in which the uniform and periodic portions are arranged.

According to an embodiment, the one or more asymmetric marks in at least one of the targets are rail-shaped marks, wherein the periodic portion comprises an array of parallel features extending in the direction perpendicular to the direction in which the uniform and the periodic portion are arranged.

According to an embodiment, at least one of the targets comprises a first group of asymmetric marks of which the uniform and periodic portions are arranged in a first direction, and a second group of the same asymmetric marks, of which the uniform and periodic portion are arranged in a second direction perpendicular to the first, and wherein $\delta S$ is determined for each of the two directions.

According to an embodiment, one or more of the targets comprises asymmetric marks configured so that the position of the centroid of the asymmetric mark patterns is detectable by an optical tool, so that the parameter S can be measured with the help of the tool, and wherein the marks are arranged in cross-shapes, each cross comprising four identical marks.

The target may comprise at least one first area and at least one second area, the marks in the second area being mirrored with respect to the marks in the first area.

According to an embodiment, the process step is a lithography step using a lithographic mask or an etch step following the lithography step and wherein the one or more targets are included in the lithographic mask.

According to an embodiment, the process step is a step of producing the device design on the lithographic mask.

The disclosure is furthermore related to a method for monitoring critical dimensions of 1-dimensional and/or 2-dimensional features arranged in a pattern and produced on a substrate by an initial process step that is part of or related to a manufacturing process for producing a semiconductor device, the process step being performed in accordance with a predefined pattern design, wherein one or more metrology targets are added to the pattern design, each target comprising one or more marks (1) of an asymmetric design, each mark comprising a uniform portion of width K (2) and a periodic portion of width L (3) arranged adjacently in a given direction (x,y), the periodic portion (3) comprising 1-dimensional or 2-dimensional features arranged in a regular array, wherein the periodic portion comprises an array of 1-dimensional features or 2-dimensional features at a design pitch (p; $p_a$, $p_b$) and wherein the design dimension of the 1-dimensional features or one of the design dimensions of the 2-dimensional features is equal to and/or situated in a range around a nominal value ($w_0$), and wherein the method further comprises additional process steps after the initial process step, thereby obtaining one or more asymmetric mark patterns not directly corresponding to the one or more asymmetric marks but derived from the one or more asymmetric marks, wherein the method comprises the following steps, performed in relation to each of the one or more targets:

Performing the initial process step, thereby obtaining one or more initial asymmetric mark patterns corresponding respectively to the one or more asymmetric marks, Defining a parameter S representative of the position of the centroid of the initial mark patterns, wherein the parameter S changes essentially linearly as a function of at least one of the design dimensions w of the of the 1-dimensional or 2-dimensional features, i.e. $dS/dw=\alpha$ with $\alpha$ a proportionality factor, determining from the initial mark patterns the shift $\delta S$ of the S-parameter for an asymmetric mark having features of design dimension $w_0$ with respect to a reference value for the S-parameter, the reference value being valid at a previously defined process operating point for the process step, Assessing on the basis of $\delta S$ the critical dimension of 1-dimensional and/or 2-dimensional features of the one or more initial mark patterns produced by the process step, and/or wherein the method comprises the following steps, performed in relation to each of the one or more targets:

Defining a parameter S representative of the position of the centroid of the derived mark patterns, wherein the parameter S changes essentially linearly as a function of at least one of the design dimensions w of the of the 1-dimensional or 2-dimensional features, i.e. $dS/dw=\alpha$ with $\alpha$ a proportionality factor, For one or more of the additional process steps:
determining from the derived mark patterns the shift $\delta S$ of the S-parameter for an asymmetric mark having features of design dimension $w_0$ with respect to a reference value for the S-parameter, the reference value being valid at a previously defined process operating point for the additional process step, Assessing on the basis of $\delta S$ the critical dimension of 1-dimensional and/or 2-dimensional features of the one or more initial mark patterns.

According to an embodiment of the method described in the previous paragraph, the method is applied for verifying pitch walk errors during the manufacturing process of arrays of semiconductor device features by self-aligned multiple patterning, where the manufacturing process includes the steps of producing—by lithography and etching—a mandrel structure that serves as a starting point for the self-aligned multiple patterning, wherein the lithography steps include the exposure of a resist layer through a lithographic mask, wherein the initial process step is the lithography step or the etch step and wherein the one or more additional process steps are the one or more steps of producing self-aligned mark patterns derived from the mandrel structure, and wherein the lithographic mask comprises one or more metrology targets, each target comprising one or more comb-shaped metrology marks, designed to produce mandrel structures comprising a base portion and a periodic portion, the periodic portion comprising a mandrel array of parallel features of equal design width $w_0$ extending outward from the base portion, the arrays of the mandrel structures having the same pitch p, and one or more different design widths of the parallel features, and wherein the derived mark patterns obtained by self-aligned multiple patterning on the basis of the mandrel structures are serpentine-shaped structures comprising arrays of increased periodicity at each self-aligned patterning step, with the position of the centroid of the serpentine-shaped structures in a direction transverse to the periodicity of the arrays being sensitive to the width of the parallel features, and wherein the method comprises determining the positions of the centroids of the serpentine structures and/or of the centroids of the mandrel structures, and evaluating the positions with respect to a condition of no or essentially no pitch walk errors occurring in one or more of the arrays of semiconductor device features produced in the manufacturing process.

According to an embodiment of the method including one or more additional process steps, the method comprises for each target:
determining the proportionality factor $\alpha$,
Calculating $\delta w_0 = \delta S/\alpha$,
Evaluating $\delta w_0$ with respect to a tolerance.

The method including one or more additional process steps may further comprise the step of evaluating $|\alpha - \alpha_0|$ with respect to a tolerance, wherein $\alpha_0$ is the value for $\alpha$ at the process operating point for the initial process or for the additional process step.

According to an embodiment of the method including one or more additional process steps:
one or more of the targets comprises asymmetric marks configured so that the position of the centroid of the asymmetric mark patterns is detectable by an optical tool, so that the parameter S can be measured with the help of the tool,
where the one or more targets include a plurality of the asymmetric marks, having the one or more design dimensions in a range around the nominal value $w_0$, and possibly including a mark having the design dimensions equal to the nominal value $w_0$,
for each of the one or more targets:
the parameter $\alpha$ is determined by fitting a linear function to the measured values of the S-parameter for the plurality of marks,
$\delta S$ is determined as $S_0 - S_{0ref}$, wherein:
$S_0$ is the parameter value for a mark pattern of a mark having features of the nominal design dimension,
$S_{0ref}$ is the reference value for the S-parameter at the process operating point for the initial process step or for the additional process step.

According to an embodiment of the method including one or more additional process steps, the one or more asymmetric marks are arranged in each of the one or more targets as mirrored pairs of identical marks, mirrored about a line perpendicular to the direction in which the uniform and periodic portion are arranged, and wherein the position-representative parameter S is a function of the distance D between the centroids of the two mirrored mark patterns representative of or derived from the two mirrored marks.

According to an embodiment of the method including one or more additional process steps, the one or more asymmetric marks are arranged in each of the one or more targets with respect to one or more symmetric marks, and wherein the position-representative parameter S is a function of the distance D between the centroid of the asymmetric mark patterns representative of or derived from the one or more asymmetric marks and the centroid of the symmetric mark pattern or patterns representative of or derived from the one or more symmetric marks.

According to an embodiment of the method including one or more additional process steps, the position representative parameter S is equal to $D - D_s$, with $D_s$ the design value of the distance between the geometric midpoints of two mirrored marks, wherein $D_s$ is a constant for each of the plurality of design widths ($w_0$, $w_{-1}$, $w_{+1}$, etc.) and for the given direction.

According to an embodiment of the method including one or more additional process steps:
one or more of the targets comprises at least a first and a second set of diffraction gratings, each set being formed of two grating marks arranged adjacently in the same direction and in a repeated manner, at least one of the grating marks in each set being an asymmetric mark as defined in the preceding claims,
the asymmetric mark of the first grating set comprising features of design dimension $w_0 - \Delta w_0$, wherein $\Delta w_0$ is a predefined offset value,
the asymmetric mark of the second grating set comprises features of design dimension $w_0 + \Delta w_0$,
$\delta S$ and $\alpha$ are calculated from the equations:

$$\alpha = (\Delta I_1 - \Delta I_2)/2\kappa\Delta w_0$$

$$\delta S = (\Delta I_1 + \Delta I_2)/2\kappa$$

wherein:
$\Delta I_1$ and $\Delta I_2$ are the differences between the plus and minus first order diffracted intensity measured on the first and second set of mark features obtained by the lithography step or the etch step, on the basis of the first and second grating set,
$\kappa$ is a diffraction factor.

According to an embodiment, $\kappa$ is calculated from a measurement of the plus and minus diffraction intensities of an additional set of two gratings located within or in the vicinity of the pattern design, each grating set formed of two marks arranged adjacently and in a repeated manner, at least one of the marks being an asymmetric mark, and wherein the distance between two adjacent marks A' and B' is different in the first grating compared to the second grating, the difference between the distances being pre-defined.

The method may further comprise for each target and for the initial process step and for at least one of the dimensions:
Calculating from $\delta S$ the shift $\delta CD$ of the critical dimension CD of features of the nominal design dimension $w_0$, with respect to the value of the critical dimension $CD_p$ at the process operating point for the initial process, and wherein $\delta CD$ is calculated as $\beta.\delta w_0$, wherein $\beta$ is a proportionality factor that expresses a linear relation between CD and the design dimension of the features, i.e. $dCD/dw = \beta$,
evaluating $\delta CD$ with respect to a tolerance.

According to an embodiment of the method including one or more additional process steps, the factor $\beta$ is calculated as $(\alpha/G)$ wherein G is proportional to L/p, with L the width in the direction of asymmetry of the periodic portion of the mark pattern or patterns and p the nominal pitch of the line features of the periodic portion.

The method including one or more additional process steps may further comprise the step of evaluating $|\beta - 1|$ with respect to a tolerance.

According to an embodiment of the method including one or more additional process steps, one or more of the targets comprises one or more asymmetric marks configured so that the position of the centroid of the printed and etched asymmetric mark patterns is detectable by an optical tool, so that the parameter S can be measured with the help of the tool, and wherein at least one target comprises a mark having at least one of the design dimensions equal to the nominal value, and wherein the method further comprises the steps of:

Calculating from δS the shift δCD of the critical dimension CD of features of the nominal design dimension $w_0$, with respect to the value of the critical dimension $CD_p$ at the process operating point for the initial or the additional process step, and wherein δCD is calculated as δS/G, wherein G is proportional to L/p with L the width of the periodic portion of the mark and p the pitch of the array of features in the direction of the dimension, evaluating δCD with respect to a tolerance.

According to an embodiment of the method including one or more additional process steps, the one or more asymmetric marks in at least one of the targets are comb-shaped marks, wherein the periodic portion comprises an array of parallel features extending in the direction in which the uniform and periodic portion are arranged.

According to an embodiment of the method including one or more additional process steps, the one or more asymmetric marks in at least one of the targets are rail-shaped marks, wherein the periodic portion comprises an array of parallel features extending in the direction perpendicular to the direction in which the uniform and the periodic portion are arranged.

According to an embodiment of the method including one or more additional process steps, at least one of the targets comprises a first group of asymmetric marks of which the uniform and periodic portions are arranged in a first direction, and a second group of the same asymmetric marks, of which the uniform and periodic portion are arranged in a second direction perpendicular to the first, and wherein δS is determined for each of the two directions.

According to an embodiment of the method including one or more additional process steps, one or more of the targets comprises asymmetric marks configured so that the position of the centroid of the asymmetric mark patterns is detectable by an optical tool, so that the parameter S can be measured with the help of the tool, and wherein the marks are arranged in cross-shapes, each cross comprising four identical marks.

The target used in the method including one or more additional process steps may comprise at least one first area and at least one second area, the marks in the second area being mirrored with respect to the marks in the first area.

According to an embodiment, the initial process step is a lithography step using a lithographic mask or an etch step following the lithography step and wherein the one or more targets are included in the lithographic mask.

According to an embodiment, the initial process step is a step of producing the device design on the lithographic mask.

The disclosure is equally related to a metrology mark applicable in the method according to the disclosure.

The disclosure is equally related to a method for determining an edge placement error between two features of two respective patterned layers of a semiconductor chip, comprising the steps of:

determining the dimensions of the first and second feature by the method of the disclosure, determining the overlay error between the first and second layer, determining the edge placement error on the basis of the overlay error, taking into account the dimensions of the first and second feature as determined in the first step.

According to an embodiment, the pattern designs for producing the two layers comprise respective parts of a hybrid target, the first part comprising marks provided in the first pattern design, the second part comprising marks provided in the second pattern design, and wherein the measurement of the overlay error between the first and second layer is obtained from an overlay value measured between printed and/or etched mark features resulting from the first and second parts.

The disclosure is equally related to a computer-implemented monitoring unit configured to be integrated in an apparatus for semiconductor processing including lithography and etching steps, the apparatus further comprising metrology tool, wherein the monitoring unit is configured to execute the steps of the method according to the disclosure.

According to an embodiment, the metrology tool is an image based overlay tool or a diffraction based overlay tool. The monitoring unit may furthermore be configured to calculate—on the basis of the results of the evaluation—updated processing parameters of one or more processes performed by the semiconductor processing apparatus, and feedback the updated parameters to the apparatus. The monitoring unit may comprise a memory provided with a computer program for executing the method steps, when the program is run on the monitoring unit.

The disclosure is equally related to a computer program product applicable in the monitoring unit of the disclosure, and configured to execute the method steps, when the program is run on the monitoring unit.

The disclosure is furthermore related to a method for verifying pitch walk errors during the manufacturing process of arrays of semiconductor device features by self-aligned multiple patterning, the manufacturing process including the steps of producing—by lithography and etching—a mandrel structure that serves as a starting point for the self-aligned multiple patterning, wherein the lithography steps include the exposure of a resist layer through a lithographic mask, wherein the lithographic mask comprises one or more metrology targets, each target comprising one or more comb-shaped metrology marks, designed to produce mandrel structures comprising a base portion and a periodic portion, the periodic portion comprising a mandrel array of parallel features of equal width extending outward from the base portion, the arrays of the mandrel structures having the same pitch p, and one or more different widths of the parallel features, and wherein the structures obtained by self-aligned multiple patterning on the basis of the mandrel structures are serpentine-shaped structures comprising arrays of increased periodicity at each self-aligned patterning step, with the position of the centroid of the serpentine-shaped structures in a direction transverse to the periodicity of the arrays being sensitive to the width of the parallel features, and wherein the method comprises determining the positions of the centroids and/or the positions of the mandrel structures and evaluating the positions with respect to a condition of no or essentially no pitch walk errors occurring in one or more of the arrays of semiconductor device features produced in the manufacturing process.

According to example embodiments of the method for verifying pitch walk errors, the lithographic mask comprises one or more metrology targets, each target comprising at least a first and second comb-shaped metrology mark, wherein the marks are designed to produce a first and second "as designed" mandrel structure comprising a base portion and a periodic portion, the periodic portion comprising an array of parallel features extending outward from the base portion, and wherein according to the "as-designed" mandrel structures:

the arrays of both mandrel structures have the same pitch p, the first mandrel structure has features of width $w_0-\Delta w$, the second mandrel structure has features of width $w_0+\Delta w$, with $w_0$ the nominal value of the feature width and p the nominal value of the array pitch used for obtaining a uniform periodicity in self-aligned structures produced on the basis of the mandrel structures, and with $\Delta w$ a predefined deviation from the nominal width, the mask comprises mandrel patterns configured for the production of arrays of device features associated to the one or more metrology targets, the associated arrays being produced by self-aligned multiple patterning on the basis of the mandrel patterns, which are designed to produce mandrel structures having features of width essentially equal to or similar to $w_0$ and pitch essentially equal to or similar to p and wherein the method comprises the steps of:

producing first and second "real" mandrel structures by lithography and etching, on the basis of the first and second comb-shaped mark. It is understood that printed versions of the mandrel structures are obtained after lithography (structures with resist material still present) after which the etched versions of the structures are obtained by the etching process (e.g., after resist removal). This means that measurements can be done on the mandrel structures after lithography as well as after etch, producing serpentine-shaped structures by one or more self-aligned patterning steps, on the basis of the first and second mandrel structures, the serpentine-shaped structures comprising arrays of increased periodicity at each patterning step, for the lithography and/or the etch step, determining the positions of the centroids of the first and second mandrel structures in a direction transversal to the mandrel arrays, and/or: for one or more of the self-aligned patterning steps, determining the positions of the centroids of the serpentine-shaped structures, in a direction transversal to the increased periodicity arrays.

evaluating the positions with respect to a condition of no or essentially no pitch walk errors occurring in the mandrel arrays and/or the serpentine structures.

According to an embodiment of the method for verifying pitch walk errors, each target further comprises one or more offset marks designed to produce, by the lithography and etch steps and by the self-aligned patterning steps, one or more offset structures, and wherein the positions of the centroids are determined with respect to a characteristic position of one or more of the offset structures.

According to an embodiment of the method for verifying pitch walk errors, each target comprises:

a first pair of marks consisting of the first comb-shaped mark and an offset mark placed at a nominal distance therefrom, a second pair of marks consisting of the second comb-shaped mark and an offset mark placed at the nominal distance therefrom, wherein the centroid positions are determined as the distances $S(+\Delta w)$ and $S(-\Delta w)$ between the centroids of the mandrel structures and/or the serpentine structures produced on the basis of the first and second mark, and a characteristic position of a structure produced on the basis of their respective offset marks.

The offset marks of the first and second pair of marks may be the mirror images of the first and second marks respectively, where the mirror images are obtained by mirroring the first and second mark about an axis parallel to the arrays, wherein the characteristic positions are the positions of the centroids of the mandrel structures and/or the serpentine structures produced on the basis of the offset marks.

The offset marks of the first and second pair of marks may be segmented symmetrical marks, wherein the characteristic positions are the positions of the centroids of array structures produced on the basis of the symmetrical segmented offset marks.

According to an embodiment of the method for verifying pitch walk errors, the mandrel patterns configured for the production of arrays of device features associated to the one or more metrology targets comprise a reference mark for each of the metrology targets, the reference mark being designed to produce a mandrel structure having a uniform portion and a periodic portion which have the same dimensions transversal to the mandrel structure as the mandrel structures for which the first and second mark are designed, the reference mark being designed for producing a mandrel array with pitch equal to p and feature width equal to $w_0$.

The reference mark for each metrology target may be included in the respective target. The mask may comprise an offset reference mark for each reference mark, the offset reference mark being designed to produce, by the lithography and etch steps and by the self-aligned patterning steps, a reference offset structure, wherein the position of the centroid of the offset structure can be determined with respect to a characteristic position of the reference offset structure.

According to an embodiment of the method for verifying pitch walk errors, the evaluation step comprises:

Calculating for each self-aligned patterning step, a parameters $$\delta S = \frac{S(+\Delta w) + S(-\Delta w)}{2} - S_0,$$

wherein $S_0$ is a reference value for the distance S, determined for a mandrel structure or a serpentine structure obtained from a comb mark with the same pitch p as the first and second mark and designed to produce a mandrel structure with nominal feature widths $w_0$, the reference value being representative of the condition of no or essentially no pitch walk errors, Comparing $\delta S$ to a tolerance, thereby evaluating a degree of pitch walk in arrays of semiconductor features produced in the manufacturing process.

The method of the method for verifying pitch walk errors may further comprise:

Calculating for each self-aligned patterning step, a parameter $$\alpha = \frac{S(+\Delta w) - S(-\Delta w)}{2\Delta w},$$

Verifying the degree to which $\alpha$ deviates from a predefined constant value $\alpha_0$.

According to an embodiment of the method for verifying pitch walk errors, the method further comprises a step of adjusting—as a function of the result of the evaluation step—one or more processing parameters applied in the manufacturing process and/or parameters applied in method for determining the centroid positions, to thereby control pitch walk during the manufacturing process of one or more semiconductor chips.

According to an embodiment of the method for verifying pitch walk errors, the target comprises multiple sets of comb-shaped marks, arranged in two mutually orthogonal directions.

The disclosure is equally related to a metrology target applicable in the method for verifying pitch walk errors according to any one of the preceding claims.

The disclosure is equally related to a computer-implemented pitch walk verification unit configured to be integrated in an apparatus for semiconductor processing including lithography, etching and self-aligned patterning steps, the apparatus further comprising a metrology tool, wherein the verification unit is configured to execute the following steps of the method for verifying pitch walk errors: determining the position of the centroids through the control of the metrology tool, and evaluating the positions with respect to a condition of no or essentially no pitch walk errors.

In a verification unit according to the disclosure, the metrology tool may be an image based overlay tool. The verification unit of the disclosure may furthermore be configured to calculate—on the basis of the results of the evaluation—updated processing parameters of one or more processes performed by the semiconductor processing apparatus, and feedback the updated parameters to the apparatus.

According to an embodiment, the verification comprises a memory provided with a computer program for executing the method steps, when the program is run on the verification unit.

The disclosure is equally related to a computer program product applicable in the verification unit of the disclosure, and configured to execute the method steps for verifying pitch walk errors, when the program is run on the verification unit.

BRIEF DESCRIPTION OF THE DRAWINGS

FIG. 1A illustrates an asymmetric metrology mark that is applicable in example methods, according to example embodiments.

FIG. 1B illustrates an asymmetric metrology mark that is applicable in example methods, according to example embodiments.

FIG. 2 illustrates the centroid position of an asymmetric mark applicable in example methods, according to example embodiments.

FIG. 13 illustrates the principle of measuring overlay errors on the basis of diffraction-based overlay targets.

FIG. 14A illustrates a diffraction grating suitable for use in example methods, according to example embodiments.

FIG. 14B illustrates a diffraction grating suitable for use in example methods, according to example embodiments.

FIG. 15A illustrates a target comprising diffraction-based marks, applicable in example methods, comprising marks with line features having widths shifted with respect to the nominal value $w_0$, according to example embodiments.

FIG. 19A illustrates design dimensions and printed or etched dimensions of two layers of line-shaped features, according to example embodiments.

FIG. 19B illustrates design dimensions and printed or etched dimensions of two layers of dot-shaped features, according to example embodiments.

FIG. 20A illustrates details of FIG. 19A, including the edge placement error (EPE), according to example embodiments.

FIG. 20B illustrates details of FIG. 19B, including the edge placement error (EPE), according to example embodiments.

FIG. 27 illustrates the intensity profiles of the spacer structures obtained after a first self-aligned patterning step, according to example embodiments.

FIG. 28 illustrates the intensity profiles of the spacer structures obtained after a second self-aligned patterning step, according to example embodiments.

DETAILED DESCRIPTION

Figures 3A, 3B:
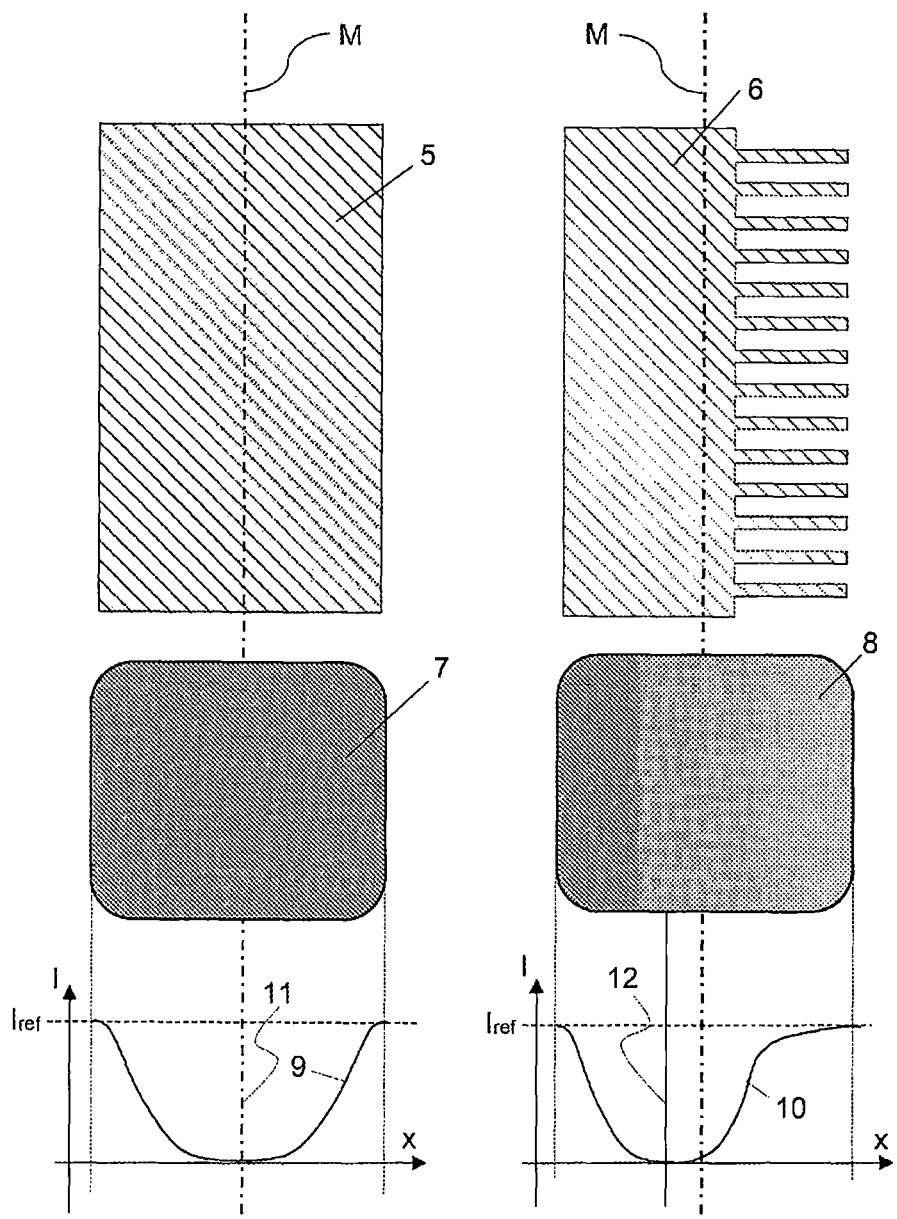
FIG. 3A illustrates how the centroid of an asymmetric mark may be determined by an optical metrology tool, according to example embodiments.
FIG. 3B illustrates how the centroid of an asymmetric mark may be determined by an optical metrology tool, according to example embodiments.

According to example embodiments, the lithographic mask used for the production of a patterned layer in a semiconductor manufacturing process is provided with one or more metrology targets comprising one or more asymmetric marks of a specific geometry. Within the present context, a "mark" is defined as a predefined pattern designed for metrology purposes. A target comprises one or more marks and is included inside or in the vicinity of the area of the mask that contains the actual pattern that is to be printed and etched to form one layer of a semiconductor chip. Typical examples of asymmetric marks which are applicable in example methods are shown in FIG. 1, which illustrates marks of the comb type (FIG. 1A) and of the rail type (FIG. 1B). Asymmetric marks applied in example methods may be design rule compatible, meaning that the marks are dimensioned and designed so that fine-pitched rectilinear features (also referred to as line features) of the printed patterns, such as the fine-pitched legs of the comb-type marks, can be transferred to a resist layer, so that the fine-pitched pattern can further be transferred to an underlying layer, by an etch process.

Example methods are however not limited to metrology performed on patterns obtained by lithographic printing and etching, but may be applied to techniques which do not include a mask. The method may also be applied to patterns obtained by process steps applied after the initial lithography and etch, e.g. deposition, further etch and polish steps performed in double patterning applications, and including a process for producing the lithographic mask itself. The present description will focus first on the initial lithography and etch steps for producing a pattern on a substrate, as a way of explaining example methods. The application to other process steps will be described further in this specification.

As illustrated in FIG. 2, an asymmetric mark 1 that is applicable in example methods comprises a uniform portion 2 and a periodic portion 3. The width K of the uniform portion is not necessarily equal to the width L of the periodic portion. The mark is reproduced on a semiconductor wafer after lithography and after etching in the form of printed and etched mark patterns respectively. FIG. 2 distinguishes between the "geometric midpoint," defined as the x location M equidistant from the mark design outer edges 21, and the geometric centroid C of the pattern. The geometric centroid C is defined as the location at which the integrated area of the pattern in the direction of asymmetry (the x-direction in this case) is half the total integrated area. In other words, the area covered by pattern features to the left and right of the geometric centroid C is the same. The geometric centroid position C of a mark pattern is sensitive to the width of the features in a periodic array of features that defines the periodic portion 3 of an asymmetric mark pattern. The periodic array may be an array of comb leg features or rail features of width w and pitch p, as illustrated in FIG. 1. For a given constant value of the pitch p of the array, narrower features cover less area than broader features, which translates into a shift in the centroid position.

Figure 22:
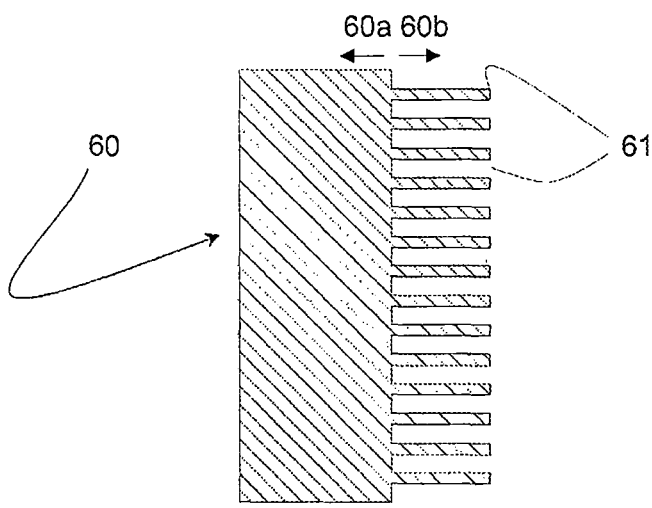
FIG. 22 is an image of a metrology mark that is applicable in example methods for monitoring pitch walk errors, according to example embodiments.

It has been determined that a linear relationship exists between the centroid shift and a shift in the feature width w, when the design dimensions K and L are maintained. On the basis of this finding, a method was developed which allows the monitoring and determination of critical dimensions during the manufacturing process. According to an embodiment involving comb-shaped marks as shown in FIG. 1A and FIG. 22, the method is applied for monitoring the occurrence of pitch walk errors in arrays of features produced by a multiple patterning process. This embodiment is described later with reference to FIGS. 22 to 33. First, a method is described for determining the centroid shift of a nano-scaled mark pattern, by determining a position that coincides with or is representative of the position of the geometric centroid C as defined above. This representative centroid position can be determined by an optical metrology tool, capable of capturing an image of the mark pattern. Such a tool is known per se in the art. In example methods, the optical metrology tool is configured so that the pitch of the printed and etched arrays (the comb legs or rails in FIG. 1) is not resolvable by the tool. FIGS. 3A and 3B illustrate the images 7 and 8 as seen by the optical metrology tool, of a symmetric mark pattern 5 (in this case a solid rectangle) and an asymmetric comb-type mark pattern 6. The geometric midpoints of the patterns are indicated by centerlines M. The tool views the patterns against a contrasting background; in the case of FIG. 3, the patterns are shown as dark fields, set against a light background (but the opposite is also possible depending on the relative reflectivity of the patterned versus unpatterned areas in the metrology wavelength band). The optical tool allows to measure the intensity profiles 9 and 10 as a function of the dimension x transversal to the mark patterns. For the symmetric mark pattern 5, the intensity profile 9 is equally symmetric. For the asymmetric mark pattern 6, as the fine pitch p is not resolvable by the optical tool, the tool sees an asymmetric intensity profile 10 across the mark. The optical tool then allows to detect the position of the image centroids 11 and 12 of the profiles. The image centroid is defined as the x location at which the x-direction-integrated intensity profile is half the total integrated intensity, i.e. the area under the profile is the same left and right of the image centroid (the image intensity integration is referenced to the level $I_{ref}$ in the case of FIG. 3). These image centroid positions coincide with or are representative of the geometric centroids of the mark patterns (i.e. a shift in the geometric centroid translates into an equal or proportional shift in the centroid of the profiles). Within the context of this description and in the appended claims, unless specifically stated, any reference to the "position of the centroid of a mark pattern" may refer to the position of the geometrical centroid or to any position representative thereof, such as the image centroid, as described above. The figures illustrate that the image centroid 12 of the asymmetric mark pattern 6 is shifted with respect to the geometric midpoint M of the pattern, whereas the image centroid 11 of the symmetric mark 5 coincides with its geometric midpoint M. According to example embodiments, the optical metrology tool that is used is an image based overlay tool (IBO), known per se in the art for the measurement of overlay errors between subsequent layers in a lithography/etch-process. This is especially useful as the IBO tool is equipped for measuring a distance between the centroids of two different mark patterns. The usefulness of such a feature will become apparent in the following description of target designs applicable in example method.

Figure 4:
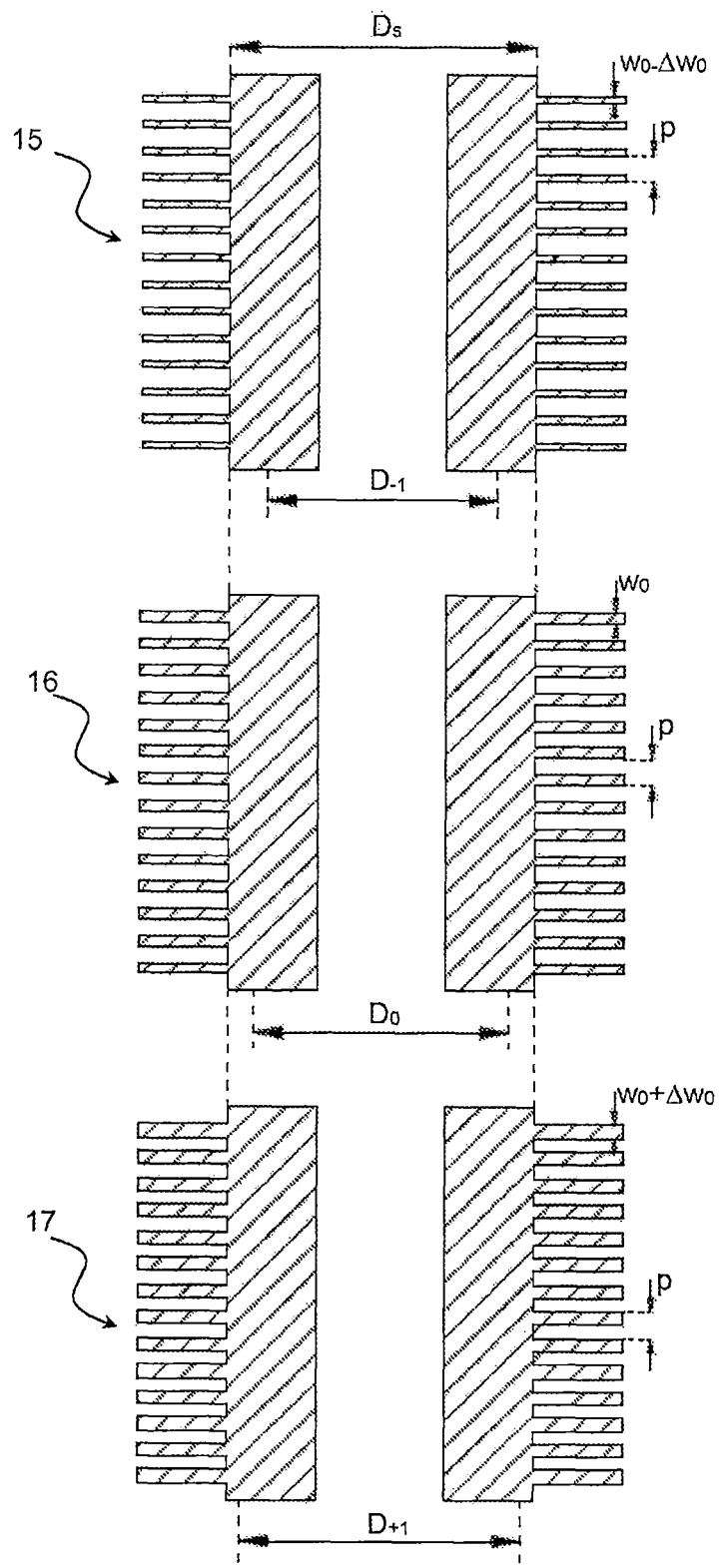
FIG. 4 illustrates a possible layout of a metrology target applicable in example methods, according to example embodiments.

FIG. 4 shows an example of a target that is applicable in example methods in combination with the use of an optical tool for capturing an image of a mark pattern, as described above (e.g. an IBO tool). The target comprises three pairs 15, 16 and 17 of comb-shaped marks, each pair comprising two identical but mirrored marks. The middle pair 16 are designed for printing and etching an array of features of nominal pitch p. The design width $w_0$ is the nominal design width of the line features of the asymmetric mark. The value $w_0$ is representative of the critical dimension of line features of a device or test pattern that is printed and etched through the mask in which the target is incorporated, as well as processed further by additional process steps such as deposition, etch, etc. The term "representative of" is explained as follows. In each process step to which example methods can be applied, line features are produced which are characterized by their line width referred to as the critical dimension CD. For each step, a process value $CD_p$ for the critical dimension of pattern features is determined during the pattern and process development stage, involving pattern design and calibration methods known in the art. The result of these development procedures is (for each process step): a set of process conditions referred to as the process operating point, and the value of $CD_p$ for a variety of pattern features. The aim of metrology methods is to determine to what degree the $CD_p$ values are actually obtained on the wafer. The mark design value $w_0$ is chosen such that the variation of $w_0$ within a given range around the design value leads to a measurable parameter (e.g. S, see further) obtained from the metrology target, which can be used to determine the deviation from $CD_p$ in each process step. This is the meaning of "$w_0$ is representative of critical dimensions of features of a device pattern". The value $w_0$ could be equal to the process value $CD_p$ in one or more process steps, but this is not a requirement and $w_0$ may differ (significantly) from $CD_p$.

As stated, the process operating point is determined for each process step, by calibration procedures known in the art. For lithography and etch steps, the process operating point is defined by an optimized dose, focus and etch parameters. During the calibration, the patterns defined by the lithography mask, i.e. the device patterns and the target patterns (for example targets as shown in FIG. 4) included in the mask are printed through a range of processing parameters, including at least the focus and dose of the lithographic tool. The focus-parameter is the deviation from a pre-defined zero-defocus setting on the exposure tool, expressed for example in nm. Dose is defined as the energy applied through the mask during exposure, expressed for example in mJ/cm$^2$. Both focus and dose are values that can be set on the lithography tool. The calibration process may be performed on a test wafer, on which the mask patterns are printed multiple times, each time with an adjustment of dose or focus. Such procedures are known in the art for the calibration of a lithography process. The test wafer is known as a focus-energy modulation (FEM) wafer. The device patterns and marks are measured by traditional measurement techniques such as SEM or AFM to determine the as-printed values of the feature widths (the CD of the device patterns and the w of the marks). For process steps other than lithography and etch, the process operating point is determined in the same way.

The process operating point for a process step that follows one or more preceding steps includes optimized conditions of all the preceding steps. For example, the process operating point of the SA1 step in a self-aligned multiple patterning process is defined by a set of optimized operating conditions for the lithography and etch steps for producing a mandrel structure, and optimized conditions for the spacer deposition following the production of the mandrel, and for the etching for removal of the mandrel.

Returning to the target design of FIG. 4, the upper pair of marks 15 comprise an array of features of design width $w_{-1}=w_0-\Delta w_0$ and pitch p. The lower pair 17 comprise an array of features of design width $w_{+1}=w_0+\Delta w_0$ and pitch p. All pairs are designed to reproduce the two mirrored patterns at a mutual distance $D_s$ with respect to each other, $D_s$ being measured between the lines that separate the uniform portions and the periodic portions of the marks. $\Delta w_0$ is a predefined offset value for the design width $w_0$.

The following steps of the method according to a first embodiment are described on the basis of printed versions of the marks of FIG. 4, i.e. before etching. The same method steps may however be performed on the basis of the etched patterns or patterns obtained by other process steps apart from lithography and etching. In FIG. 4, the detected centroid positions (e.g., by the optical IBO tool as described above) are indicated for the printed mark patterns of the three pairs of marks. A parameter S is defined as $D-D_s$, wherein D is the distance between the centroids of the image of the two mirrored marks, and $D_s$ is the above-described design distance between the geometric midpoints of the marks. FIG. 4 shows an embodiment in which the geometric midpoints of the asymmetric marks lie at the boundary between the uniform and periodic areas of the mark (implying K=L), but this is not required, as is shown for mark 6 in FIG. 3. $D_s$ is a constant determined by the mark design and the relative position of marks within a target design. S is a parameter that is representative of the centroid position of either of the mirrored marks of each pair, measured in the x-direction. A shift in the centroid results in a change in the parameter S. Other choices for the parameter S are possible, for example the distance D itself can be used as such a parameter, but in any case S is a linear function of the centroid shift measured in the x-direction. The centroid shift, and thereby S can be measured by an IBO tool, in the manner described above, by detecting the centroids of the observed intensity profiles of the images of two mirrored marks and measuring their mutual distance in the x-direction. For the printed patterns of the three mark pairs, the measurement yields three values, labelled $S_0$, $S_{-1}$ and $S_{+1}$:

$$S_{-1} = D\_1 - D_s$$

$$S_0 = D_0 - D_s \quad (1)$$

$$S_{+1} = D_{+1} - D_s$$

Figure 5:
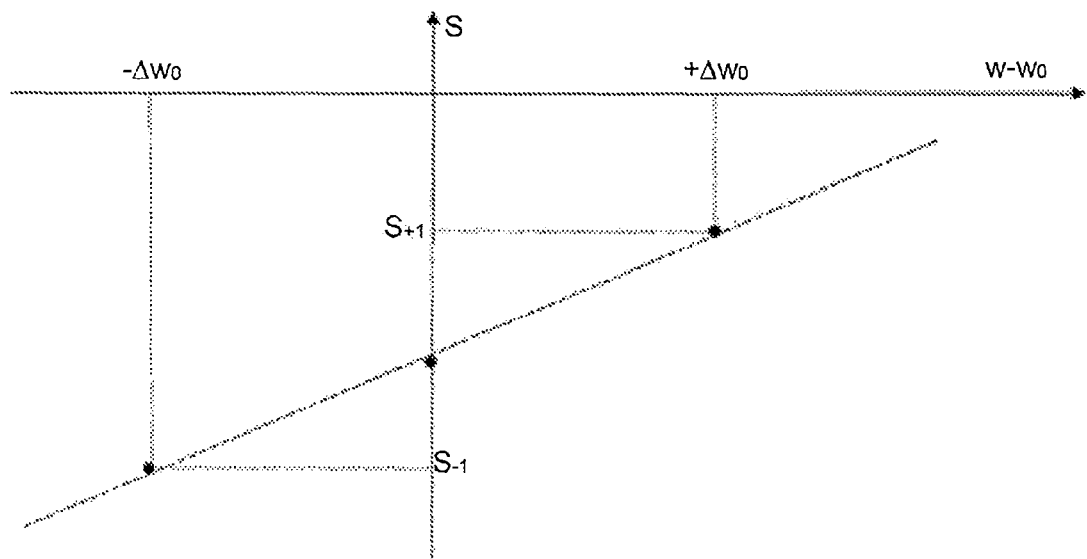
FIG. 5 illustrates a graph showing the relation between feature widths of an asymmetric mark and a parameter S that is representative of the centroid position, according to example embodiments.

The relation between the S-values and the design values of the feature width w is then determined. For comb-shaped and rail-shaped asymmetric marks, this relationship is approximately linear provided the design dimensions K and L are maintained for the comb and rail arrays. As illustrated in FIG. 5, the data points can be approximated by a best-fitting linear function:

$$S = \alpha(w - w_0) + b \quad (2)$$

The linear-fitting may be done by any optimization method known in the art, for example by a least-squares optimization algorithm. The result of this procedure is the parameter $\alpha$. The slope $\alpha$ represents the rate of change of S as a function of the design width w, i.e.

$$\alpha = \frac{dS}{dw} \quad (3)$$

Following this, a parameter $\delta w_0$ is calculated as:

$$\delta w_0 = \delta S / \alpha = (S_0 - S_{0ref}) / \alpha \quad (4)$$

$S_{0ref}$ is the S-parameter determined for a printed mark pattern at the process operating point for the lithography step, see above.

The value $\delta w_0$ obtained from equation (4) is the effective shift of the design width represented by the printed target, with respect to the print under the reference conditions of the process operating point. When $\delta w_0$ is different from zero, this means that the device pattern has been printed as if the design width of the mark features has shifted over the value $\delta w_0$. Therefore, it does not necessarily mean that the critical dimension of the printed features of design width $w_0$ has shifted over this value. The determination of $\delta w_0$ is however an indicator for deviations from the desired on-wafer dimensions. $\delta w_0$ may thus be compared to a tolerance, thereby allowing to make an assessment of the print quality of line features produced by the lithography step.

Figure 6:
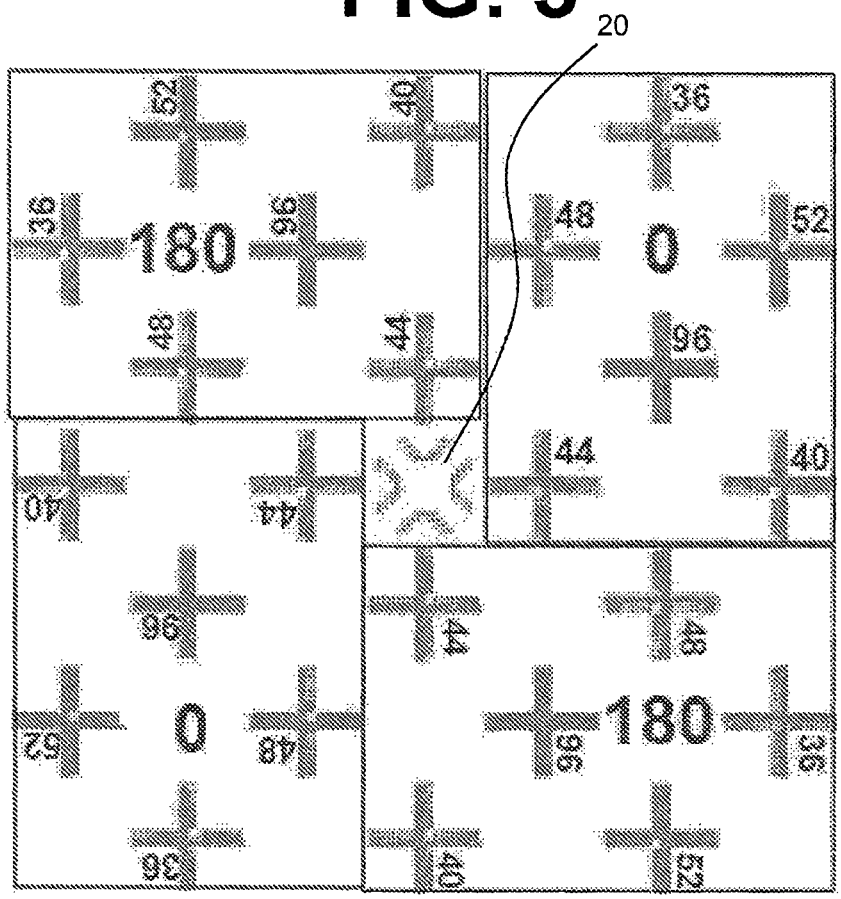
FIG. 6 illustrates another metrology target applicable in example methods, according to example embodiments.

In some embodiments, a plurality of targets are included in the lithography mask. According to the first embodiment, each target comprises a plurality of asymmetric marks having a uniform portion and a periodic portion. In some embodiments, comb-type marks and/or rail-type marks are used. Each target may include asymmetric marks characterized by different design widths w of the features (legs or rails), for example, including a mark with design width of the features equal to a nominal value $w_0$ and further including a number of design widths in a range around the $w_0$-value. The various widths may not necessarily be shifted by fixed amounts from $w_0$ (like in the previous example: shifts of $-\Delta w_0$ and $+\Delta w_0$), but they might be distributed across a given range that corresponds to an expected error margin for the critical dimensions of features produced in the various steps of the manufacturing process. FIG. 6 shows another example of a target layout that is applicable in example embodiments. The target comprises comb-type marks arranged in cross-shaped layouts. The numbers next to each cross indicate the respective design widths in nm of the comb legs of the marks that constitute the cross-shapes. The $w_0$ value is 44 nm and the design pitch p in each array of features is 96 nm. The target comprises two areas marked by "0" and two areas marked by "180". This indicates that marks from the "0" areas are mirrored with respect to marks from the "180" areas. The asymmetric marks are arranged around a central mark 20 that serves as a positioning reference for the imaging tool used to measure the centroid shifts. As stated above, this may be an IBO tool which is equipped to measure the distance D between one of the mark centroids in a "0" area with respect to the corresponding mark centroid in a "180" area. The arrangement of the marks in a cross-design allows to measure D in two orthogonal directions x and y, i.e. to obtain $S_x = D_x - D_s$ and $S_y = D_y - D_s$ for each of the design widths. The $S_0$-value (in x and y) used for equation (4) is measured on the mark pair designed for line widths equal to the nominal $w_0$ (see equations (1)). The $S_{0ref}$ value is obtained for the same mark pair, under the conditions defined by the process operating point. When the target does not comprise a mark with line features designed for the nominal width $w_0$ but only marks designed for widths in a range around $w_0$, the $S_0$ and $S_{0ref}$ values may be obtained from the intersection of the best-fitting linear curve and the y-axis.

Figure 7A:
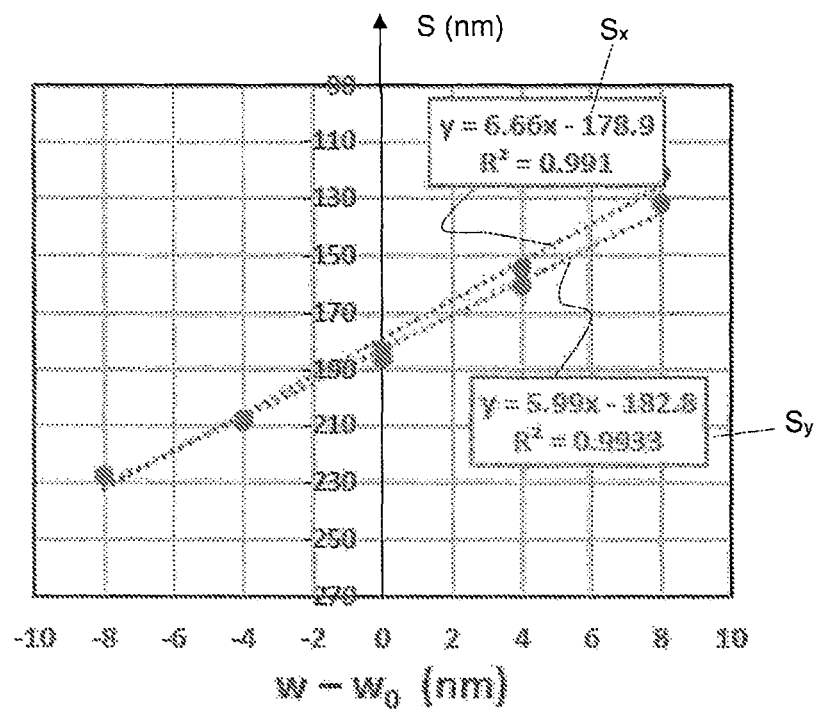
FIG. 7A show correlation graphs obtained from measurements on a target having a layout as shown in FIG. 6, according to example embodiments.

FIG. 7A shows $S_x$ and $S_y$ as a function of $(w-w_0)$ for the target of FIG. 6, as measured during the calibration procedure, at the process operating point, therefore at the reference dose and focus conditions for the lithography step. The graph includes the numerical linear approximations of the data as well as the square of the correlation coefficient $R^2$, which is a measure for the linear relationship between the x and y values (values close to 1 indicate excellent linearity), confirming the fact that the relation between S and the design widths is approximately linear for $S_x$ as well as for $S_y$. From the best fit of the data points, the proportionality factor $\alpha_0$ can be derived, in x- and y direction:

$$\alpha_{0x} = 6.7$$

$$\alpha_{0y} = 6$$

Figure 7B:
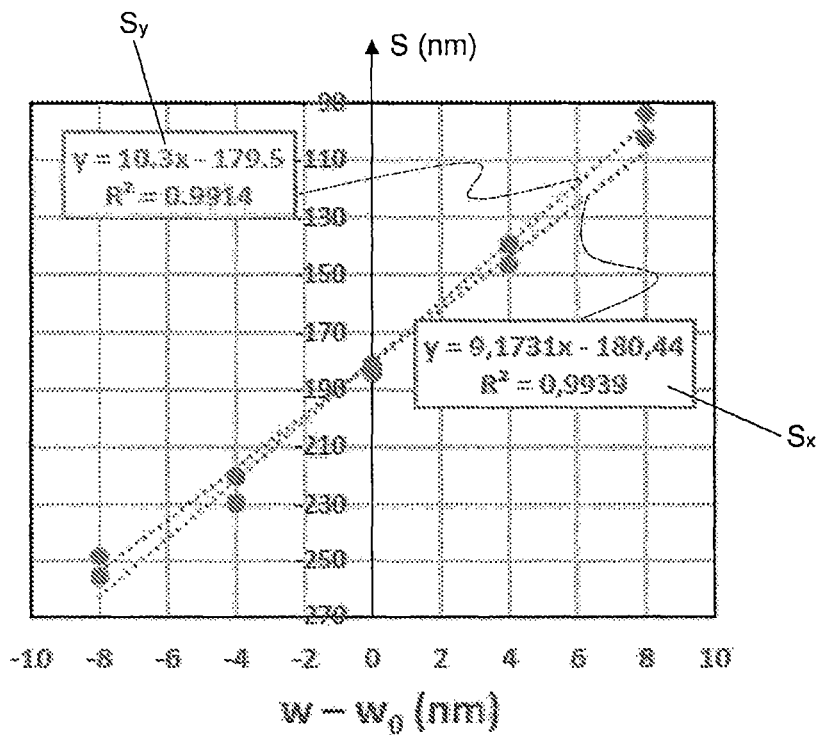
FIG. 7B show correlation graphs obtained from measurements on a target having a layout as shown in FIG. 6, according to example embodiments.

The suffix "0" indicates that these $\alpha$-values are obtained at the process operating point. The calibration value $S_{0ref}$ is found as the S-value for $w = w_0$. In this case, $S_{0ref} \approx 185$ nm in x and y direction. FIG. 7B illustrates the same graph for a rail-type mark, designed also for $w_0=44$ nm and $p=96$ nm. The linear relation is again apparent.

The $\alpha_0$-values themselves can be used for verifying the stability of the manufacturing process and the metrology process, when example methods are performed. In practice, a plurality of n targets, for example targets of the type shown in FIG. 6, may be distributed between and around the manufactured device patterns printed with the lithography mask into which the targets are incorporated. Each of the n targets yields a number of S-values (in x and y) for each of the design widths included in the target (e.g. $w=36$ nm, 40 nm, 44 nm, 48 nm, 52 nm, 96 nm). For $w=96$ nm the mark is just a symmetric rectangle and no shift is detected. For each target, the best fit of the data points yields a value for $\alpha$, resulting in a series of values $\alpha_i(I=1 \ldots n)$. Deviations from $\alpha_0$ indicate a process instability or an instability in the metrology process. A mask may also comprise targets of different designs, for example designed for different $w_0$ and/or p values. In that case each target design results in S and $\alpha$ values which are to be assessed with respect to specific values of $S_{0ref}$ and $\alpha_0$.

To summarize: on the basis of the latter example of n targets of the design of FIG. 6, distributed across the field of view of the lithography mask, the following steps are performed according to the first embodiment:

The lithographic printing step is performed, i.e. the mask is exposed to a light source and the mask patterns are reproduced on a resist layer, resulting in visible mark patterns on the resist layer, with nano-scaled dimensions, For each target i (i=1 . . . n), the values $S_x$ and $S_y$ are measured for the design widths 36 nm, 40 nm, 44 nm, 48 nm, 52 nm. Measurement may be done by an IBO tool as described above.

In each target, the proportionality factors $\alpha_{ix}$ and $\alpha_{iy}$ are determined from the best linear fit of the data points in a graph that sets out S as a function of $(w-w_0)$, The shift in the design width $\delta w_{0x}$ and $\delta w_{0y}$ is calculated from equation (4), on the basis of a previous calibration from which $S_{0xref}$ and $S_{0yref}$ have been obtained, $\delta w_{0x}$ and $\delta w_{0y}$ are assessed with respect to a tolerance, The values of $\alpha_{ix}$ and $\alpha_{iy}$ are compared to the values obtained in the calibration procedure $\alpha_{0x}$ and $\alpha_{0y}$. $|\alpha_{ix}-\alpha_{0x}|$ and $|\alpha_{iy}-\alpha_{0y}|$ are compared to a tolerance.

The assessment of $\delta w_{0x}$ and $\delta w_{0y}$ gives an indication of possible inadmissible deviations from the critical dimensions of line features in the printed device patterns. In some embodiments, the various targets are placed in close proximity to critical device features for which the CD monitoring is used. The various targets may be designed for different values of $w_0$. The monitoring of $|\alpha_{ix}-\alpha_{0x}|$ and $|\alpha_{iy}-\alpha_{0y}|$ gives an additional indication of possible process irregularities, as well as instability of the metrology process as such.

The same method steps may be performed on the basis of the etched patterns, i.e. after resist development and etching to reproduce the actual patterns on a semiconductor wafer. This yields an additional set of values $\delta w_{0x}$ and $\delta w_{0y}$ (computed on the basis of specific $S_{0xref}$ and $S_{0yref}$ values), and $|\alpha_{ix}-\alpha_{0x}|$ and $|\alpha_{iy}-\alpha_{0y}|$, to be assessed with respect to a specific tolerance. The calibration procedure for determining $S_{0xref}$ and $S_{0yref}$ is again a FEM-based procedure, taking into account not only variations of the lithographic parameters, but also of etch parameters, such as etch time, etch rate, voltage, chamber pressure, etc.

As stated above, the shift $\delta w_0$ in the design feature width w is not necessarily equal to the shift of the actual critical dimension of device features on the wafer which are designed to be essentially equal to $w_0$ and which are printed as part of or in the vicinity of a target as described above and shown by example embodiments in FIGS. 4 and 6. According to a second embodiment, an estimation of the actual CD shift, hereafter referred to as $\delta CD$ is determined on the basis of IBO-type targets as described above and of which an example is shown in FIGS. 4 and 6. The shift is determined with respect to the critical dimension value $CD_p$ obtained at the process operating point, of line features produced in a process step and, designed for the nominal width value $w_0$ or derived from such mark line features (for example line features obtained in a double patterning process). For variations about this process operating point representative of the anticipated manufacturing variation, the width CD of a line feature produced in the process step can thus be written as:

$$CD = CD_p + \delta CD \quad (5)$$

A factor $\beta$ can furthermore be calculated so that:

$$\delta CD = \beta \cdot \delta w_0 \quad (6)$$

The factor $\beta$ represents the rate of change of CD as a function of the change of the design width w:

$$\beta = \frac{dCD}{dw} \quad (7)$$

Figure 8:
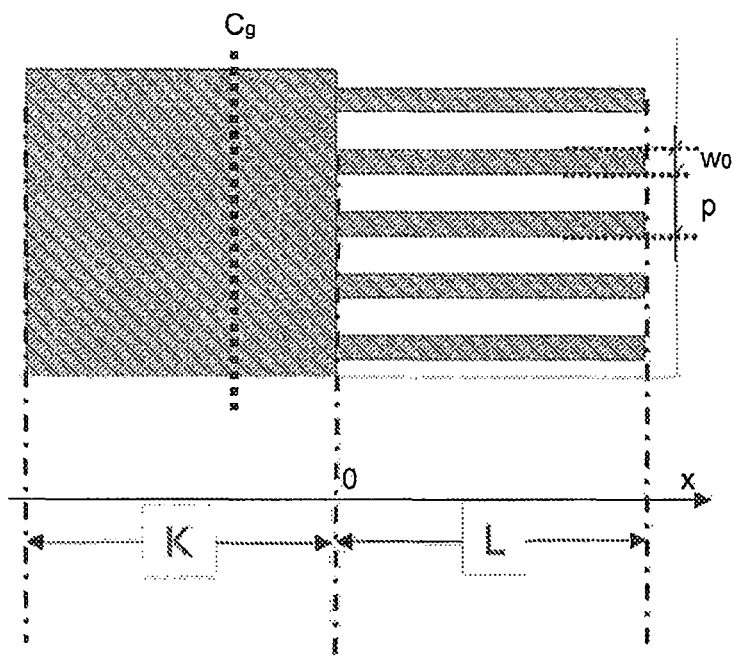
FIG. 8 illustrates the position of the geometrical centroid of a comb-mark applicable in example methods, wherein the line features have design width equal to a nominal value $w_0$, according to example embodiments.

The factor $\beta$ is directly related to $\alpha$ as will be demonstrated hereafter for the lithography step by which a mark is first reproduced on a wafer. FIG. 8 shows the design dimensions of a comb mark having a uniform portion of width K and a periodic portion of width L, measured in the direction of asymmetry x. The periodic portion comprises comb features of width $w_0$ at pitch p. The location in the x-direction of the geometric centroid $C_g$ is given by the following formula:

$$C_g = \frac{1}{2}\left(\frac{L}{p}w_0 - K\right) \quad (8)$$

Figure 9:
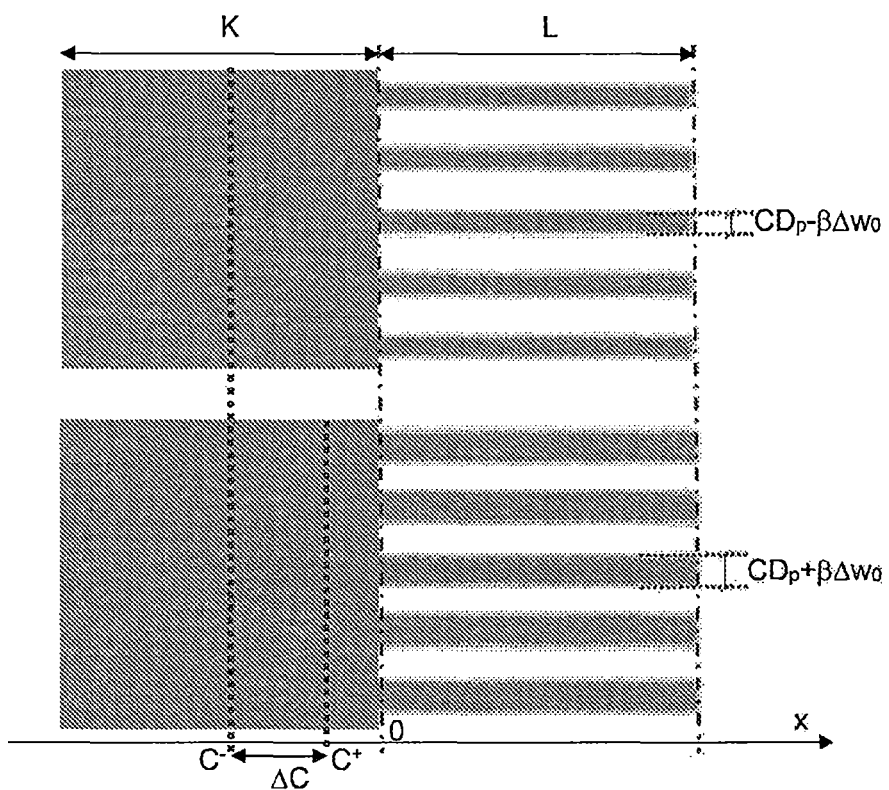
FIG. 9 illustrates two mark patterns obtained by printing or etching on the basis of a mark of the type shown in FIG. 8, wherein the line features have deliberately shifted design widths on either side of the nominal value $w_0$, according to example embodiments.

This follows from the condition that the surface area of the mark pattern is the same to the left and right of $C_g$. FIG. 9 shows two printed mark features obtained from two different variations of the mark shown in FIG. 8. The upper mark pattern is obtained from a comb mark as in FIG. 8 but with comb features of design width $w_0 - \Delta w_0$, while the lower mark pattern is obtained from a comb mark as in FIG. 8 but with comb features of target width $w_0 + \Delta w_0$. $\Delta w_0$ is a predefined offset value. With $\beta$ defined as in formula (6), the width of the printed comb features in FIG. 9 can thus be written as $CD_p - \beta \Delta w_0$ and $CD_p + \beta \Delta w_0$ respectively, the value $CD_p$ as defined above, i.e. the critical dimension at the process operating point.

The position of the centroids $C^-$ and $C^+$ along the x-axis can be written on the basis of formula (6), as follows:

$$C^- = \frac{1}{2}\left(\frac{L}{p}(CD_p - \beta \Delta w_0) - K\right) \quad (9)$$

$$C^+ = \frac{1}{2}\left(\frac{L}{p}(CD_p + \beta \Delta w_0) - K\right) \quad (10)$$

Subtracting equations (10) and (9) yields:

$$\Delta C = C^+ - C^- = (L/p)\beta \Delta w_0 = g \beta \Delta w_0 \quad (11)$$

With g=L/p defined as the intrinsic gain factor of the mark design. From the fact that the parameter S in FIG. 4 is derived from mirrored marks, it follows that:

$$|\Delta S|=2|\Delta C|=G\beta\Delta w_0 \quad (12)$$

Where the gain of the mirrored mark pair is G=2g. Taking into account that $\alpha=\Delta S/\Delta w_0$ it follows that $\beta=\alpha/G$, i.e. given the mark designs and their arrangement within the target, $\beta$ can be calculated directly from $\alpha$.

During manufacturing, $\alpha$ and $\beta$ can be determined at each process step (e.g. at litho, etch, polish, SA1, SA2, . . . ) allowing the determination and assessment of $\delta w_0$ as described above, while an estimation of the on-wafer CD can thus be calculated as $CD=CD_p+\beta\delta w_0$.

The factor $\beta$ can be referred to as a patterning/metrology fidelity factor with $\beta$ equal to 1 for perfect fidelity. $\beta$ embodies various known effects (e.g., defocus, MEEF, LER, proximity bias, aberration, etc.) that may influence pattern transfer and measurement. While $\beta$ can change with each patterning step (litho, etch, deposition, etc.), and can depend on mark orientation, particularly for anisotropic lithography illumination, it should be relatively constant for a given set of process/metrology conditions. The value of $\beta$ itself may be used in example methods for monitoring process or metrology instabilities, which may be flagged when $|\beta-1|$ exceeds a given tolerance.

The parameter g=L/p is a constant based on the mark design and referred to here as the intrinsic mark amplification factor. In order to enhance metrology signal to noise ratio, the marks may be designed so that g is significantly higher than 1. This ensures for example that L is effectively a constant in the printed and etched versions of a mark pattern, so that the relation between $\alpha$ and $\beta$ holds (and provided K is also constant). During experiments, it was found that high values can be obtained for the proportionality factor $\alpha$. This means that example methods reach higher levels of accuracy than existing metrology methods.

The invention is not limited to the above embodiments of targets suitable for image-based determination of $\delta S$, $\alpha$, $\beta$ and $\delta CD$ (such as by using IBO tools for determining the centroid positions). Any relative mark placement measurement is always made between two or more marks. Instead of pairs of mirrored asymmetric marks, the target may comprise pairs of a symmetric mark and an asymmetric mark. The centroid of the symmetric mark serves as a reference for the position of the centroids of the asymmetric marks having different design values of the feature width w. The position-dependent parameter may then be measured as the distance between the centroid of a symmetric mark and the centroid of the paired asymmetric mark. The targets could even comprise a single symmetric mark, for example placed centrally in the target design, and serving also as a positioning reference, wherein all the asymmetric marks are referenced with respect to the single symmetric mark in the above-described manner, i.e. by measuring the shifting difference of the asymmetric mark centroids with respect to the centroid of the single symmetric mark. All the above-described method steps and formulas remain valid for these variations of the target and mark designs. Each asymmetric mark is characterized by an intrinsic gain factor g=L/p; where, by definition, g=0 for symmetric marks. For mirrored mark pairs $G=g_1+g_2=L_1/p_1+L_2/p_2$. Thus, when one of the marks is symmetrical, G=g; whereas, when the mirrored marks are identical G=2g, as in Equation 12.

For a target comprised of asymmetric marks as described above, the relation between $\beta$ and $\alpha$ can be written as:

$$\beta=\alpha/G \quad (13)$$

with G the constant gain factor dependent on the mark design and arrangement. G is generally proportional to g=L/p, such as G=g or G=2g. Equation (13) is valid at least for comb-marks and rail-marks, and for process steps wherein the mark pattern obtained by the process step maintains the original shape of the marks (e.g. first lithography and etch steps, deposition step, polish step).

For any mark pattern derived from an asymmetric mark applicable in example embodiments, an estimation of the factor $\beta$ can be obtained by a linear fitting (done by any optimization method known in the art), for example by a least-squares optimization algorithm, in an analogue way as for the determination of $\alpha$ described above, i.e. based on a target comprising asymmetric marks with different design widths w of the line features, in a range about a nominal value. In this way, the linear relation is determined between the measured CD-values of different mark patterns on the substrate (measured for example by SEM) and the design values of the different mark patterns with design widths w about $w_0$. The result of this procedure represents an estimation of the parameter $\beta$.

A specific embodiment for the image-based determination of a parameter S follows from the following observations. From equations (4) and (6) and (13), it follows that:

$$\delta CD=\beta\delta w_0=(\alpha/G)(\delta S/\alpha), \text{ so that}$$

$$\delta CD=\delta S/G \quad (14)$$

As G is constant, the CD shift with respect to $CD_p$ can thus be determined from one measurement of $S_0$, i.e. from a single measurement of the S-parameter on a pair of mirrored asymmetric marks comprising line features of design width $w_0$. This represents a "basic" embodiment, where an "IBO type" target may comprise only a single asymmetric mark type, designed for $w_0$ (for example a single pair of mirrored marks with line features of design width $w_0$, i.e. the central pair 16 of FIG. 4). The marks designed for widths in a range around $w_0$ are not required in this case. According to this embodiment however, $\delta w_0$, $\alpha$ and $\beta$ are not determined and the above-described monitoring of process and metrology instability cannot be performed.

Figure 10:
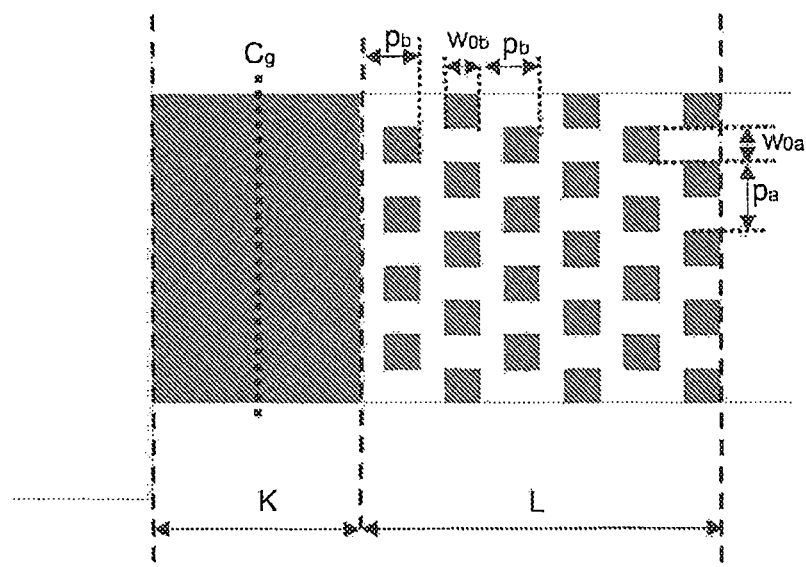
FIG. 10 illustrates another example of asymmetric mark applicable in example methods, wherein the periodic portion of the mark has periodicity in two orthogonal directions, according to example embodiments.

An example of an asymmetric mark that is suitable for use in example methods and that comprises an array of 2-dimensional features is shown in FIG. 10. The drawing shows the target dimensions of the mark. The mark again has a uniform portion 2 with width K in the x-direction and a periodic portion 3 having width L in the x-direction. The periodic portion now has periodicity in two orthogonal dimensions x and y, i.e. the mark features are rectangular dots of width $w_{0b}$ in the x-direction and height $w_{0a}$ in the y-direction. The pitch of the mark features in the x and y direction is respectively $p_b$ and $p_a$. The position of the geometric centroid $C_g$ can again be calculated by expressing the condition that the surface of mark features to the left and right of the centroid position is the same. This yields:

$$C_g=\frac{1}{2}\left(\frac{w_{0a}w_{0b}}{p_a p_b}L-K\right) \quad (15)$$

Figure 11:
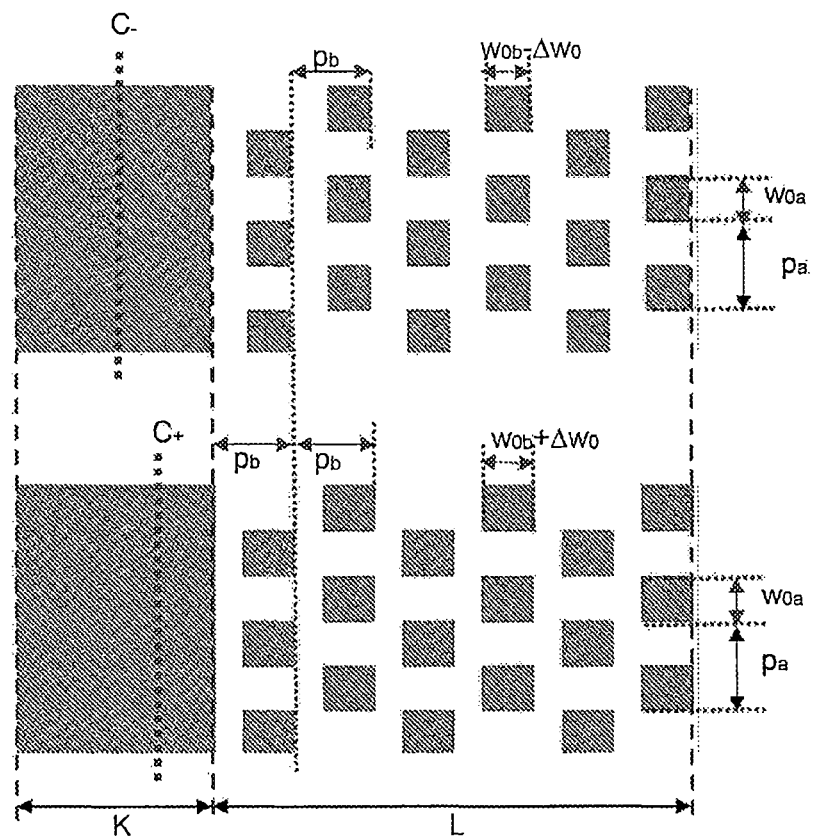
FIG. 11 illustrates two marks of the form shown in FIG. 10, but wherein the design width, in one of the orthogonal directions, of the periodically repeating features is deliberately shifted with respect to a nominal value on either side of the nominal value, according to example embodiments.

FIG. 11 shows images of the design dimensions of two marks based on the mark of FIG. 10, but with a deliberate offset of the design width $w_{0b}$ of the mark features in the x-direction. The offset is respectively $+\Delta w_0$ and $-\Delta w_0$, with $\Delta w_0$ a predefined value, with $\Delta w_0 \ll w_{0b}$. The offset is added or detracted at the side of the design width $w_{0b}$ that faces the non-periodic portion with width K of the mark (the left-hand side in the drawings), so that the dimension L is maintained. The design width $w_{0a}$ in the y-direction remains unchanged. The pitch in x and y directions also remains the same, $p_b$ and $p_a$ respectively. The geometric centroid of the marks in FIG. 11 is shifted in the x-direction with respect to the centroid position in FIG. 10, to respective centroid positions $C_g^-$ and $C_g^+$. These positions are expressed as:

$$C_g^- = \frac{1}{2}[(g_b(w_{0b} - \Delta w_0) - K)] \quad (16)$$

$$C_g^+ = \frac{1}{2}[(g_b(w_{0b} + \Delta w_0) - K)] \quad (17)$$

Wherein $g_b = \frac{w_{0a}}{p_a p_b}L$

Figure 12:
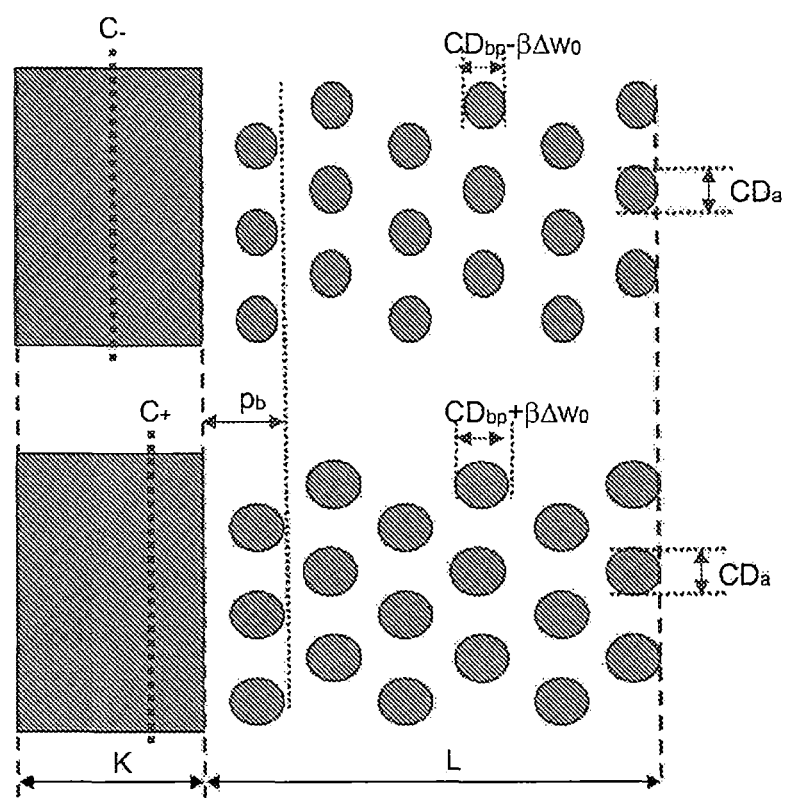
FIG. 12 illustrates a printed or etched set of mark patterns obtained from the mark design of FIG. 11, according to example embodiments.

A target comprising mirrored pairs of the three marks shown in FIGS. 10 and 11, and possibly comprising additional marks with offset values different from $+\Delta w_0$ and $-\Delta w_0$, can be applied in example methods in the same way as the target of FIG. 4. The centroid shifts can be measured by an IBO tool configured so that the pitches $p_b$ and $p_a$ of the printed and etched marks are not resolvable by the tool. In this way, the centroid shifts can be detected by the tool through analysis of the image intensity, as explained with regard to FIG. 3. This analysis results in the δS-values (obtained from the measured $S_0$ and the previously measured $S_{0ref}$ obtained at process setup) for the various mark pairs, the α-value and the design width offset in the x-direction $\delta w_{0b}$, in the same manner as described above. The β-value is again directly related to the α-value, through the amplification factor $g_b$. This is explained on the basis of FIG. 12, which shows an image of the mark patterns obtained when the marks of FIG. 11 are printed or etched. The critical dimensions of the mark features in the x-direction can respectively be written as $CD_{bp}-\beta\Delta w_0$ and $CD_{bp}+\beta\Delta w_0$. Therefore, the centroid positions C− and C+ are:

$$C-=\frac{1}{2}[(g_b(CD_{bp} - \beta\Delta w_0) - K)] \quad (18)$$

$$C+=\frac{1}{2}[(g_b(CD_{bp} + \beta\Delta w_0) - K)] \quad (19)$$

Wherein $CD_{bp}$ is the width in the x-direction of the mark features having design width $w_{0b}$ as printed or etched under the conditions of the process operating point for the print or etch step. Subtracting equations (19) and (18), and applying the relationship of equation (12) then yields:

$$\Delta C = C+ - C- = \Delta S/2 = g_b\beta\Delta w_0, \quad (20)$$

so that β can again be found as $\beta=\alpha/2g$, which allows to estimate the critical dimension in the x-direction as:

$$CD_b = CD_{bp} + \beta\cdot\delta w_{0b} \quad (21)$$

Instead of applying targets designed for measurement using an image-based tool such as IBO tools, example methods may employ targets which allow a measurement based on diffraction phenomena. This measurement may be done in a manner known in the art and by a tool known in the art for measuring overlay errors between two layers, known as a DBO (diffraction based overlay) tool. FIG. 13 shows the layout of a DBO overlay target as known in the art, formed of an arrangement of optically distinct elements (A,B) in an interlaced diffraction grating configuration with a pitch "P", typically on the order of 500-1000 nm. In other words, a first grating consisting of elements A is interlaced with a second grating consisting of elements B. Within each period "P" are the repeating elements (A,B). The grating elements A and B might be sufficiently different to cause a measurable difference between the plus and minus first order diffracted intensity $\Delta I = I_{+1} - I_{-1}$. This intensity difference is measured in a DBO overlay tool. It is a measure for the overlay value OVL which allows to determine overlay errors when the elements A and B are printed through different lithography masks.

A DBO target applicable in example embodiments comprises a similar interlaced grating configuration, but with elements A and B included in the same lithographic mask. In the terminology of example embodiments, elements A and B are referred to hereafter as "marks" or "grating marks". In addition, at least one of the marks A or B is asymmetric in the sense described above. FIGS. 14A and 14B show two examples of the layout of a DBO target applicable in example embodiments. In the first example (FIG. 14A), mark A is symmetric and mark B is asymmetric: it is a comb mark comprising a fine structure arranged at a pitch p<<P. p is lower than P to a degree that precludes diffraction induced by the fine structure itself, which could confound or detract from the diffraction from the grating elements at the coarse pitch P. FIG. 14B shows an example where both A and B are asymmetric. A and B cannot be mirror images however: they might have dimensions sufficiently different to cause a measurable difference in the plus and minus first order diffracted intensity. The marks applied in at least one grating might be asymmetric in order for patterning process conditions to induce a relative movement of the centroids C of the asymmetric marks B of one printed and/or etched grating with respect to the centroids C' of the marks A of the symmetric grating (FIG. 14A) or with respect to the centroids C' of the marks A of the opposing asymmetric grating (FIG. 14B). Such relative movements cause a proportional change in the relative intensity of the plus and minus first order diffraction from the gratings. Thus, a DBO tool can measure a centroid shift by measuring that intensity difference on a printed or etched or otherwise processed version of the DBO target, formed of the grating sets formed of the printed or etched marks or otherwise processed A and B.

A DBO target according to example embodiments comprises two sets of interlaced grating marks, each comprising an asymmetric mark with intentionally and oppositely shifted widths of the mark features in the periodic portion of the mark. An example of a suitable target design is shown in FIG. 15A. The target comprises a first and second set of gratings 30 and 31. The first grating set 30 comprises interlaced grating marks A and B1. A is a symmetric grating mark formed of line features having a design width $w_0$ and B1 is a comb mark with mark features having design width $w_0-\Delta w_0$. The second grating set 31 comprises interlaced grating marks A and B2. A is the same symmetric grating mark as the one used for the first grating set 30 and B2 is a comb mark with mark features having design width $w_{0+}\Delta w_0$, i.e. designed for printing and etching features of that width. The dimensions K and L are the same for both asymmetric mark gratings B1 and B2. The mark A may not necessarily be a mark with line features designed for width w0. Any symmetric mark design is applicable for use as mark A.

Figure 15B:
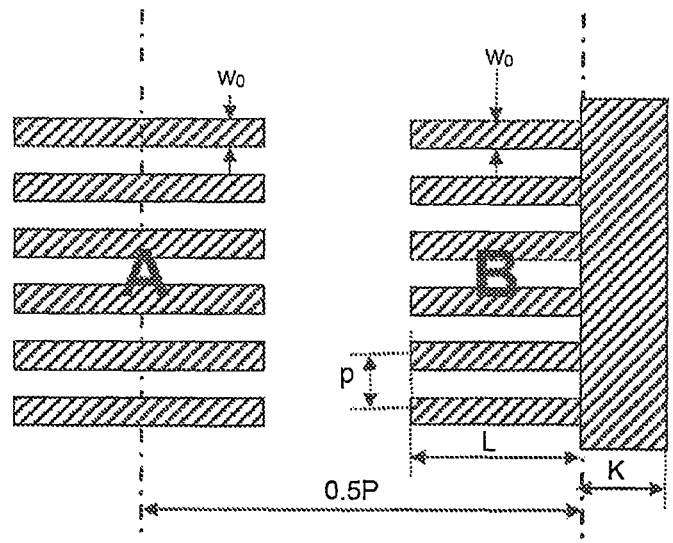
FIG. 15B illustrates marks with line features having widths shifted with respect to the nominal value $w_0$, according to example embodiments.

FIG. 15B shows the same target design except that the widths of the comb features are designed to be equal to $w_0$. Grating mark A is the same as in FIG. 15A, grating mark B is the same as B1 and B2 except for the difference in comb feature width. The target designs of FIG. 15A are offset versions with respect to the design of FIG. 15B by subtracting and adding the offset value $\Delta w_0$, in the manner illustrated for IBO targets in FIG. 4. The design of FIG. 15B is not necessarily included in a DBO target suitable for example methods. In the mark design of FIG. 15B, the distance between the centroids of the grating marks A and B is 0.5P.

Figure 16:
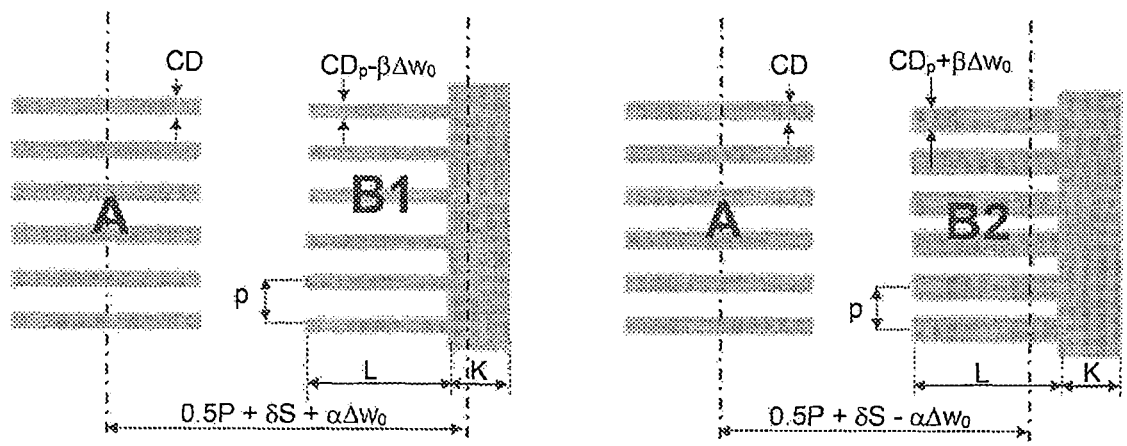
FIG. 16 illustrates a target comprising diffraction-based marks, wherein the design width of the line features is equal to the nominal width $w_0$, according to example embodiments.

When the gratings 30 and 31 are printed and etched, the centroids of the printed and etched grating marks B1 and B2 will shift as a function of the offset value $\Delta w_0$. This is illustrated in FIG. 16 which shows the printed or etched mark pattern obtained from the target of FIG. 15A. The distance between the centroids of the mark gratings A and B1 and A and B2 is chosen as the parameter S representative of the centroid position of the grating marks. In accordance with equation (3), the distance S is a linear function of the design width, i.e. this distance is respectively shifted for the two gratings shown in FIG. 15A by a value of $+\alpha\Delta w_0$ and $-\alpha\Delta w_0$, relative to the distance for a printed or etched target according to FIG. 15B, i.e. wherein the line features are designed for the width $w_0$. The latter distance is equal to $0.5P+\delta S$, where $\delta S$ is defined as in equation (4). Therefore, the respective distances between the centroids of the mark features in FIG. 16 are:

$$S_1 = 0.5P + \delta S + \alpha\Delta w_0 \quad (22)$$

$$S_2 = 0.5P + \delta S - \alpha\Delta w_0 \quad (23)$$

The intensity differences $\Delta I_1$ and $\Delta I_2$ are measured on the printed or etched versions of the two gratings 30 and 31, using a DBO tool. These parameters are proportional to the values $\delta S + \alpha\Delta w_0$ and $\delta S - \alpha\Delta w_0$ via a diffraction coefficient $\kappa$:

$$\Delta I_1 = \kappa(\delta S + \alpha\Delta w_0) \quad (24)$$

$$\Delta I_2 = \kappa(\delta S - \alpha\Delta w_0) \quad (25)$$

Solving $\delta S$ and $\alpha$ from these equations leads to:

$$\alpha = (\Delta I_1 - \Delta I_2)/2\kappa\Delta w_0 \quad (26)$$

$$\delta S = (\Delta I_1 + \Delta I_2)/2\kappa \quad (27)$$

Figure 17:
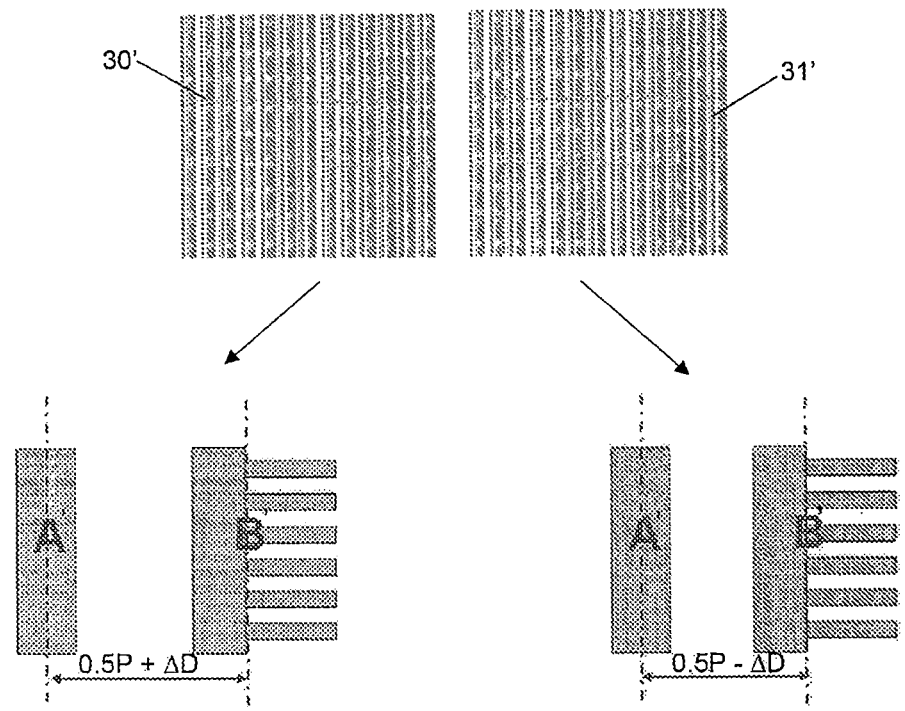
FIG. 17 illustrates an auxiliary target applicable for determining a diffraction factor κ, according to example embodiments.

The coefficient $\kappa$ can be determined from a measurement on a target comprising sets of gratings similar to FIG. 15A. These grating sets are shown in FIG. 17. The target comprises two sets of gratings 30' and 31' formed by the same marks A' and B' but with a well-defined difference in the distance between two adjacent marks A' and B'. The pitch P is the same for both sets of gratings 30' and 31'. In grating set 30', the 'as designed' distance between the centroids of two adjacent marks A' and B' is $0.5P+\Delta D$. In grating set 31', this distance is $0.5P-\Delta D$. The shift $\Delta D$ is a well-defined value that is significantly smaller than 0.5P so that grating sets 30' and 31' represent slightly shifted versions of the grating with $\Delta D=0$. When the target is printed or etched, the centroid position of the asymmetric mark B' will be shifted over a distance $\delta$. This means that:

the distance between the printed or etched mark patterns A' and B' in grating set 30 is $0.5P+\Delta D+\delta$, the distance between the printed or etched mark patterns A' and B' in grating set 31 is $0.5P-\Delta D+\delta$.

The intensity differences $\Delta I_1$ and $\Delta I_2$ are measured on the printed or etched versions of the two gratings, using the DBO tool. Once again, these parameters are proportional to the values $\Delta D+\delta$ and $-\Delta D+\delta$ via the diffraction coefficient $\kappa$:

$$\Delta I_1 = \kappa(\Delta D + \delta) \quad (28)$$

$$\Delta I_2 = \kappa(-\Delta D + \delta) \quad (29)$$

Solving $\kappa$ and $\delta$ from these equations leads to:

$$\kappa = (\Delta I_1 - \Delta I_2)/2\Delta D \quad (30)$$

$$\delta = \Delta D(\Delta I_1 + \Delta I_2)/(\Delta I_1 - \Delta I_2) \quad (31)$$

In this way, the target shown in FIG. 17 allows to calculate $\kappa$. Equations (26) and (27) then allow to calculate $\delta S$ and $\alpha$. The factor $\beta$ can again be calculated from $\alpha$. As the parameter S is now the distance between a symmetric mark A and an asymmetric mark (B, B1 or B2) and not between two mirrored asymmetric marks, the relation between $\alpha$ and $\beta$ is:

$\beta = \alpha/g$ with $g$ the amplification factor $L/p$

Once again, $\beta$ allows to estimate the critical dimension of line features designed for width $w_0$, from equations (5) and (6), wherein $\delta w_0$ equals $\delta S/\alpha$. $CD_p$ is determined during a calibration procedure when the process operating point is determined, as described in relation to the IBO embodiment.

If a grating set as shown in FIG. 17 is not available, $\kappa$ could be known from specifications of the DBO tool, or from other experiments. If $\kappa$ is unknown, example methods can still be performed, except that $\beta$ cannot be directly calculated from $\alpha$. From equations (26) and (27), $\kappa$ can be eliminated, yielding:

$$\delta w_0 = \delta S/\alpha = (\Delta I_1 + \Delta I_2)\Delta w_0/(\Delta I_1 - \Delta I_2) \quad (32)$$

This equation thus allows to calculate $\delta w_0$ obtained from equation (4) when an IBO-type target is used. The assessment of $\delta w_0$ can then be done in the same way as described above for the IBO embodiment.

Figure 18:
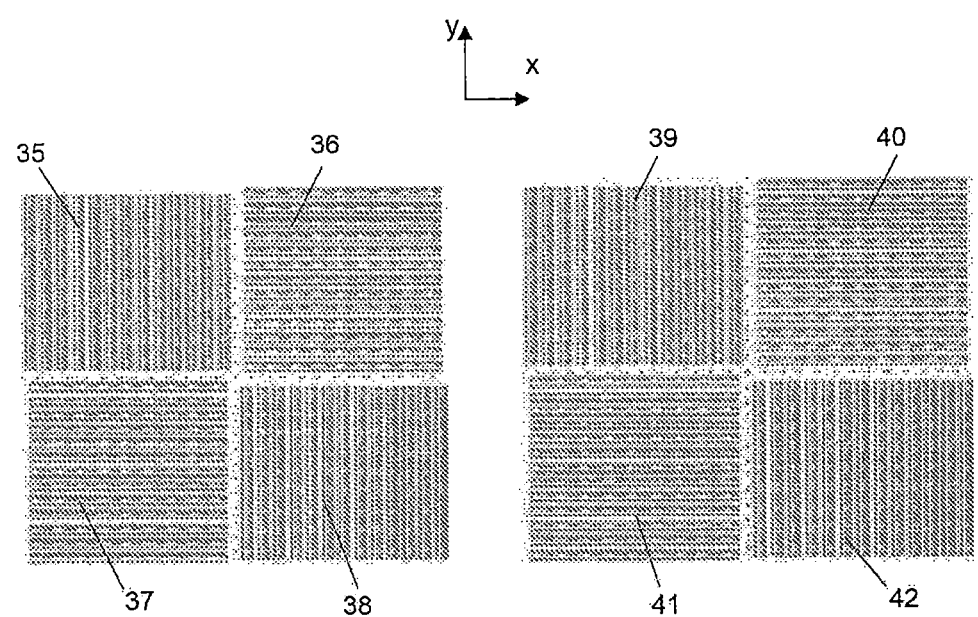
FIG. 18 illustrates a diffraction-based target applicable in example methods for evaluating critical dimensions in two orthogonal directions, according to example embodiments.
Figure 21:
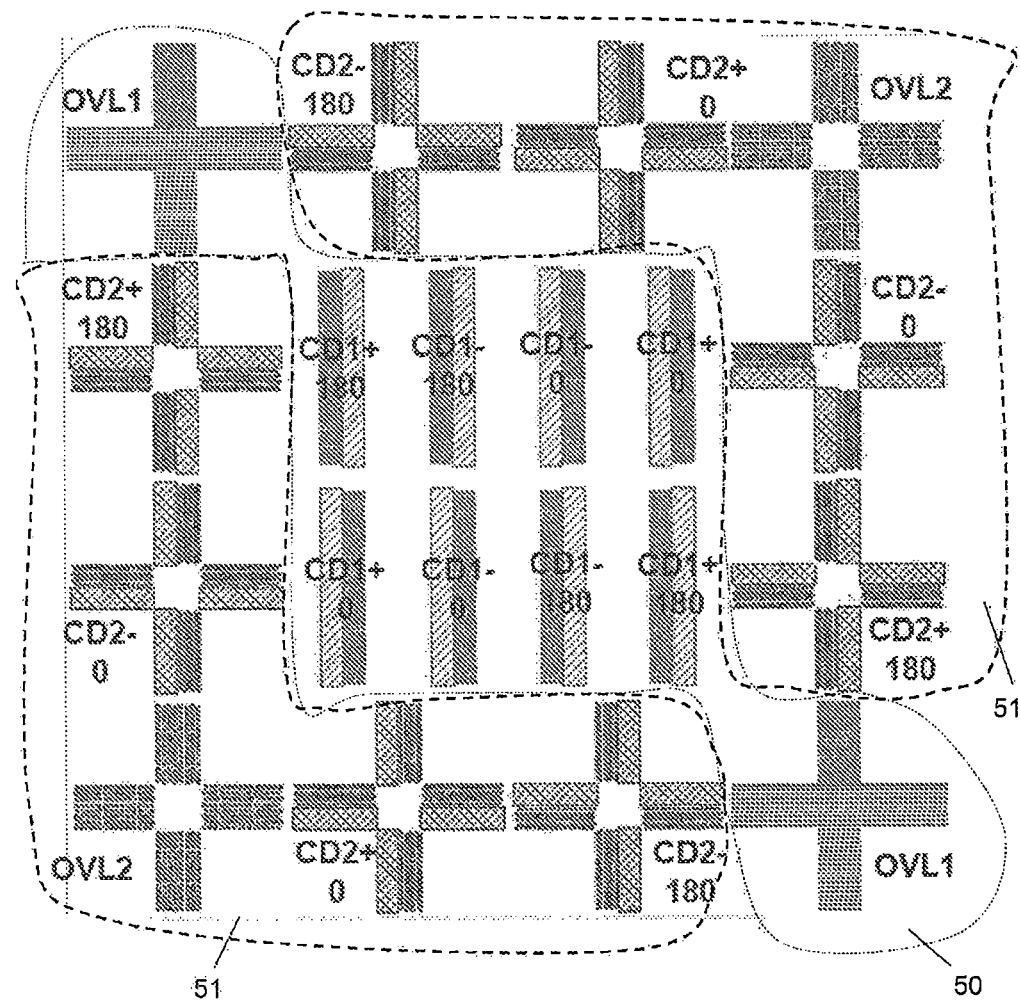
FIG. 21 shows an example of a hybrid target, suitable for determining an edge placement error, according to example embodiments.

The DBO-type targets of FIGS. 15A and 17 thus allow to perform example methods according to the first and second embodiments described above, including the assessment of $|\alpha - \alpha_0|$ and of $|\beta - 1|$ with respect to a tolerance. Also in analogy with the IBO-type targets, DBO-type targets may include grating sets oriented in two orthogonal directions x and y, for the assessment of the critical dimensions in x and y. FIG. 18 illustrates an example of a typical DBO-type target applicable in various embodiments. Grating sets 35 to 38 represent two pairs of grating sets like the one shown in FIG. 15A (i.e. including comb-marks with deliberately offset line feature widths), for determining $\delta S_x$ and $\delta S_y$. Gratings sets 39-42 comprise two pairs of grating sets like the one shown in FIG. 17, for determining $\kappa_x$ and $\kappa_y$. Grating sets 39-42 may not necessarily form a single target area together with the grating sets 35-38, but these grating sets 39-42 could be placed in separate target area in the vicinity of the pattern that is to be produced, such as in the vicinity of the grating sets 35-38.

According to a further embodiment, the estimated critical dimensions determined in the manner described above may be used for estimating an edge placement error (EPE) between features produced in two different layers. This may be achieved by applying the method as described above in each layer based on targets having design widths which are representative of the features in question, and further taking into account the overlay error between the two layers.

FIG. 19A shows an example of a two-layer structure, the first layer comprising an array of parallel line-shaped features 40, and the second comprising an array of rectangular features 41 overlying the lines. This typically occurs when patterning an array of metal lines in the first layer and an array of contact vias in the second layer, wherein the vias may overlap the lines in order to connect the lines to an upper level of a 3D interconnect structure.

FIG. 19A shows the as-designed dimensions of the lines 40 and the via features 41 and of the degree of overlap between the layers. FIG. 19B shows a possible situation after the actual production steps of the layers (i.e. lithography and etching of both layers). The lines 40 are reproduced as lines 40' and the rectangular via features are reproduced as ellipse-shaped features 41'. FIGS. 20A and 20B show details of the images of FIGS. 19A and 19B. The width in the y-direction of the line features 40' as printed and etched is referred to as CD1y. The width in the y-direction of the via features 41' is referred to as CD2y. The fact that these dimensions deviate from the as-designed values, together with an overlay error OVL between the two layers, results in the fact that to one side of the line features, the via features do not overlap these line features. This error is referred to as the edge placement error (EPE) and as illustrated in FIG. 20B, this error is quantified as:

$$EPE=D_0+OVL-(CD1y+CD2y)/2, \quad (33)$$

Wherein $D_0$ is the design distance between the center lines of the line features 40 and the via features 41.

Example methods allows to estimate CD1y and CD2y by including an optical (e.g. IBO-based) or a diffraction (e.g. DBO based) target in each of the masks used to print and etch the layers, wherein the optical or diffraction targets are designed on the basis of the design dimensions of the line and contact via features 40 and 41. The mask for the first layer may for example comprise an IBO-type target similar to the one shown in FIG. 4, wherein $w_0$ equals the design dimension of the line features 40. The mask for the second layer may comprise an IBO type target comprising mirrored pairs of the marks illustrated in FIGS. 10 and 11 wherein at least the design dimension $w_{oa}$ in the y direction is equal to the design y-dimension of the via features 41.

CD1y and CD2y are determined by performing example methods on the two layers. OVL is an overlay measurement between the two layers, as known in the art and performed by an IBO tool or a DBO tool depending on whether the marks are optical or diffraction based. From equation (33), the EPE can then be calculated. This is a straightforward way of determining edge placement errors, without requiring SEM measurements or the like.

The targets described so far can be used for determining the OVL value, for example by measuring the shift of a pair of mirrored mark patterns obtained from the target shown in FIG. 4, the shift being measured between the version of the mark pair in the first layer with respect to the version of the same mark pair in the second layer.

Alternatively, a hybrid IBO-type target may be devised, comprising a first set of marks included in the first lithographic mask and a second set of marks included in the second lithographic mask. FIG. 22 shows an example of such a target design. The marks in area 50 are in the first mask, those in areas 51 are in the second mask. The comb-shaped marks CD1− and CD1+ have line features of design width $w_0-\Delta w_0$ and $w_0+\Delta w_0$ respectively, $\Delta w0$ representing a pre-defined offset of the line width in the y-direction. In the first mask, several pairs of mirrored marks of each type (CD1− and CD1+) are available, for the measurement of the distance S between centroids of these two mark types, allowing to determine CD1y in accordance with the above-described embodiments, e.g. determine α from a linear curve fit, determine δS, determine $CD1y=CD1y_0+\delta CD1y$, with $\delta CD1y=\beta \delta w_0$, with $\beta=\alpha/G$, $G=2L/p$ and $\delta w_0=\delta S/\alpha$.

The second mask comprises cross-wise arranged versions of asymmetric marks having a 2-dimensional-array of via-type features in the periodic portion: the vertically arranged marks CD2+ and CD2− respectively have via type features of design dimensions in the y-direction $w_{0y}+\Delta w_0$ and $w_{0y}-\Delta w_0$. This allows to determine CD2y according to example methods. The horizontally arranged marks CD2+ and CD2− respectively have via type features of design dimensions in the x-direction $w_{0x}+\Delta w_0$ and $w_{0x}-\Delta w_0$. This allows to determine CD2x according to example methods. In addition, each mask comprises marks OVL1 and OVL2 which are dedicated to measuring the overlay error OVL, by measuring the shift of one of the marks OVL2 with respect to one of the marks OVL1, in x and y direction.

As stated, the method according to any of the above-described embodiments, is not only applicable to lithography and etching steps. The same method steps may be based on asymmetrical mark patterns produced by additional process steps, wherein the mark patterns produced by these steps are not actual reproductions of the asymmetric marks, but wherein the mark patterns are derived from the asymmetric marks. The assessment of the critical dimensions of the 1-dimensional or 2-dimensional features of the asymmetrical mark patterns may be based on the actual reproductions of these mark patterns, as produced by lithography and etch for example. This has been described above. These mark patterns are referred to in the context of this specification and a number of the appended claims as "initial" mark patterns. This assessment may however also be based on the derived asymmetric mark patterns, or it may be based on both the initial and on the derived mark patterns. For example, a further processing step may be the deposition of a spacer on an etched comb-shaped mark pattern followed by the removal of the original comb-shaped mark pattern, leaving a serpentine mark pattern. This is what is known as the SA1 step in a self-aligned double patterning process. Even though the resulting mark pattern no longer has the shape of the original mark, the pattern has a degree of asymmetry which allows to determine the position of the centroid and thereby the value of the parameter S as a function of the w-design values around $w_0$. $S_{0ref}$ may again be measured at the process operating point for this particular step. This allows to determine α, δS and $\delta w_0$ as described above. The same may be done for the SA2 step, which is a repetition of the spacer deposition and removal process performed in SA1, but based on the serpentine structure obtained as a result of SA1. The δS values obtained from these derived mark patterns also allow to assess the critical dimensions of the comb features of the mandrel structure obtained by lithography and etch or by another method. When these critical dimensions deviate from the nominal value $w_0$, this results in the phenomenon of pitch walking in the arrays produced by self-aligned multiple patterning. In this way, the assessment of the critical dimensions of the comb features based on the δS value obtained from patterns obtained after SA1 and SA2 is in fact an assessment of pitch walking occurring in these patterns. This particular embodiment is described in more detail hereafter. This embodiment may include targets comprising comb-shaped marks 60 as shown in FIG. 22.

Figures 23A, 23B, 23C:
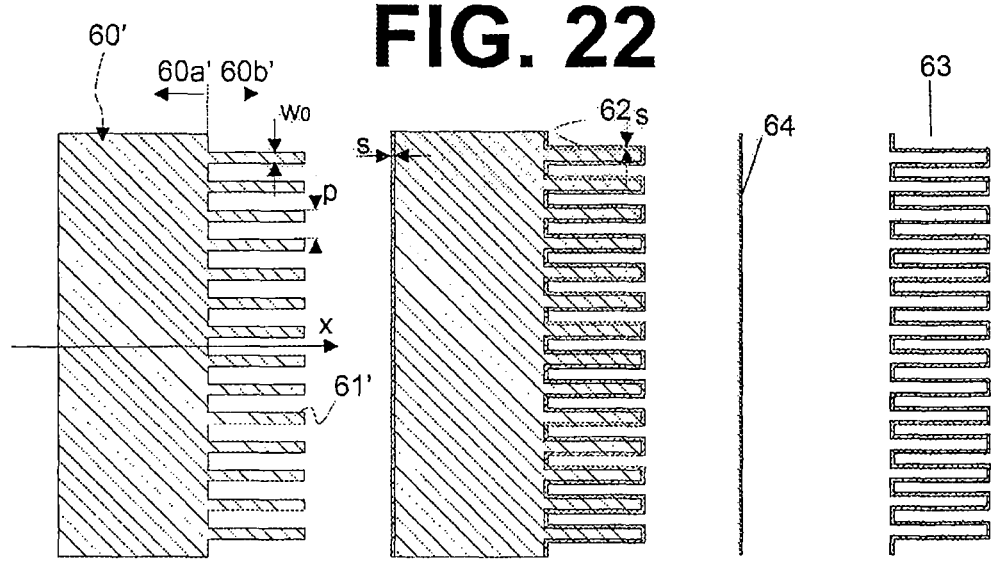
FIG. 23A illustrates a step in a self-aligned multiple patterning process applied on a structure obtained through a metrology mark of the type shown in FIG. 22, according to example embodiments.
FIG. 23B illustrates a step in a self-aligned multiple patterning process applied on a structure obtained through a metrology mark of the type shown in FIG. 22, according to example embodiments.
FIG. 23C illustrates a step in a self-aligned multiple patterning process applied on a structure obtained through a metrology mark of the type shown in FIG. 22, according to example embodiments.

The mark 60 comprises a rectangular base portion 60a and a periodic portion 60b, the periodic portion comprising a plurality of mutually parallel features 61 forming an array. When included in a lithographic mask, this mark allows to print a pattern of the same shape as the mark onto a resist layer produced on a semiconductor wafer, and to etch the wafer so that a mandrel structure 60' of the same shape is formed on the wafer, as illustrated in FIG. 23A, having a rectangular base portion 60a' and a periodic portion 60b' comprising an array of line-shaped features 61'. The mark 60 is configured to produce a mandrel with specific dimensions, defined by a width $w_0$ of the features 61' and pitch p of the feature array. In other words, $w_0$ and p are the dimensions for which the mark is designed. Process instabilities or non-uniformities may cause a deviation from these values, which may in turn lead to pitch walk errors when an SAxP process is applied to the mandrel structure. Example methods aim to detect such errors.

Figures 23D, 23E:
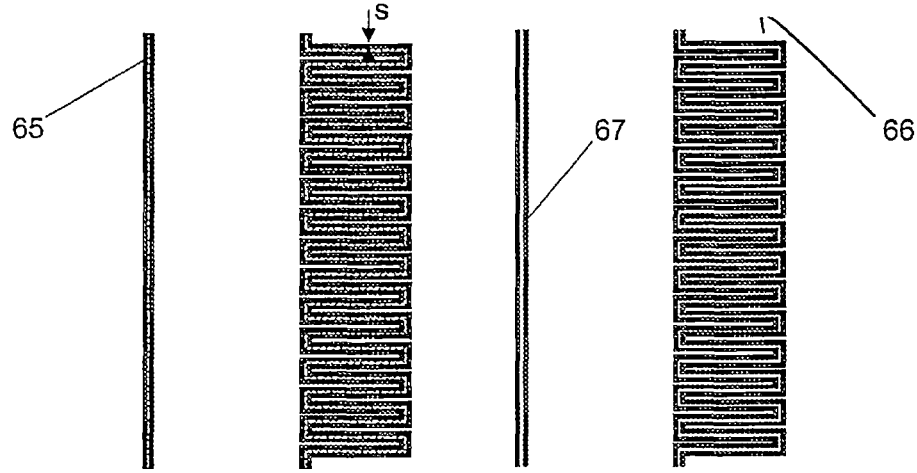
FIG. 23D illustrates a step in a self-aligned multiple patterning process applied on a structure obtained through a metrology mark of the type shown in FIG. 22, according to example embodiments.
FIG. 23E illustrates a step in a self-aligned multiple patterning process applied on a structure obtained through a metrology mark of the type shown in FIG. 22, according to example embodiments.

By way of example, FIGS. 23B-23E show the processing of the mark of FIG. 1 through a self-aligned quadruple patterning (SAQP) process, starting from the mandrel of FIG. 2A, i.e. characterized by the design dimensions $w_0$ and p. When a first self-aligned patterning step (commonly referred to as SA1) is performed on this mandrel structure, spacers 62 are produced of width s on the sidewalls of the mandrel structure as shown in FIG. 23B. After that, the mandrel structure itself is removed. As shown in FIG. 23C, this leaves a serpentine spacer structure 63 at the location of the features, and a line feature 64 on the opposite side of the original mandrel structure. A further self-aligned patterning step (SA2) repeats the procedure using the structures of FIG. 23C as a mandrel, see FIG. 23D, i.e. a spacer 65 of width s is produced on the sidewalls of the first serpentine structure 63 and of the line feature 64. When the serpentine mandrel 63 and the line feature 64 are removed, as shown in FIG. 23E, a double set of intertwined serpentines 66 is obtained to one side of the original mark, and a double line 67 to the other side. FIG. 23E represents the final step of the SAQP process, whereby the periodic mandrel elements of FIG. 23A are transformed to an array of the spacer material having four times the spatial frequency of the original mandrel array. Critical to this transformation is a well-controlled dimensional relationship among the original mandrel pitch (p), the original mandrel element widths ($w_0$), and the spacer widths (s). Self-aligned processes to produce multiples of spatial frequency other than four may include different relationships among the various pattern elements to ensure a resulting regularly periodic structure, but the methodology is similar. In all cases, the spacer formation creates connecting loops at the ends of the periodic mandrel elements that run parallel to the periodicity.

Figure 24:
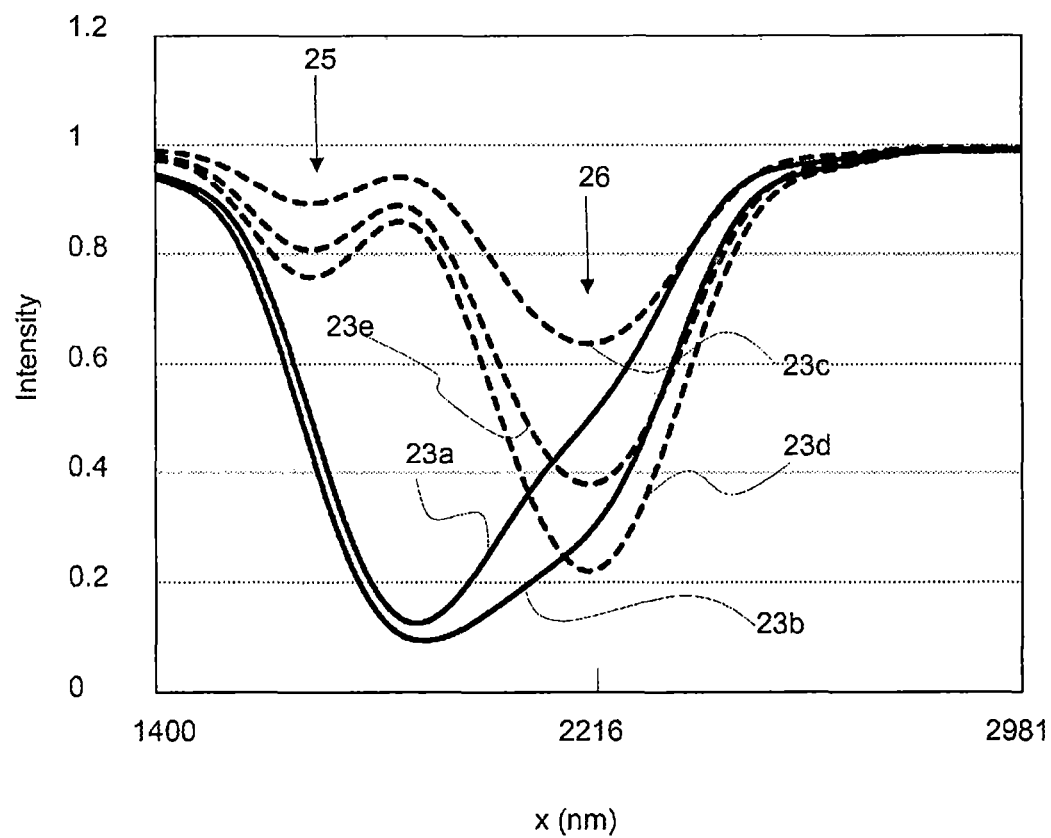
FIG. 24 illustrates the intensity profiles corresponding to the various stages of the SAxP process steps shown in FIGS. 23A-23E, according to example embodiments.

FIG. 24 first shows simulated intensity profiles representative of optical images corresponding to the consecutive structures illustrated in FIGS. 23A to 23E for the case of w=48 nm, p=128 nm s=16 nm. The curves are numbered with the numerals 2a-2e which correspond to the respective figures. It is seen that the images of the structures obtained after removal of the mandrel, represented by curves 23c-23e, all have a first minimum 25 in the intensity profile, which corresponds to the line features 64,65 and 67 on the left-hand side of the structures, and a second minimum 26. For simulated structures, this second minimum corresponds to the centroid of the serpentine structures 63 and 66. The intensity at this second minimum 26 depends on the density of the spacer pattern making up the various serpentine structures. The higher the spacer pattern density, the greater is the intensity contrast corresponding to the serpentine structure. For the perfectly executed SAQP process, the serpentine structures 63 and 66 are symmetric. This means that the second intensity minimum 26 is located at the geometrical midpoint in the x-direction, of the serpentine structures 63 and 66. On a real structure (not simulated), a position representative of the intensity minimum is the centroid of the serpentine structure in the x-direction, detectable by an optical metrology tool, in the manner described above.

In accordance with example embodiments, the position along the x-axis of the centroid of the serpentine structures is highly sensitive to a shift in the width w of the original features 60' of the mandrel structure. This sensitivity is used to create a metrology target that allows to monitor pitch walk. The method for monitoring pitch walk according to example embodiments is based on the inclusion of one or more metrology targets in a lithographic mask, each target comprising one or more asymmetric comb-shaped marks of the type described above. The centroid of the serpentine structures obtained by self-aligned multiple patterning on the basis of these marks is detected and the position of these centroids and/or of the centroids of the mandrel structures produced on the basis of the comb-shaped marks, in a direction transverse to the periodicity of the arrays contained in the serpentine structures is determined and evaluated with respect to a condition of no or essentially no pitch walk.

Figure 25:
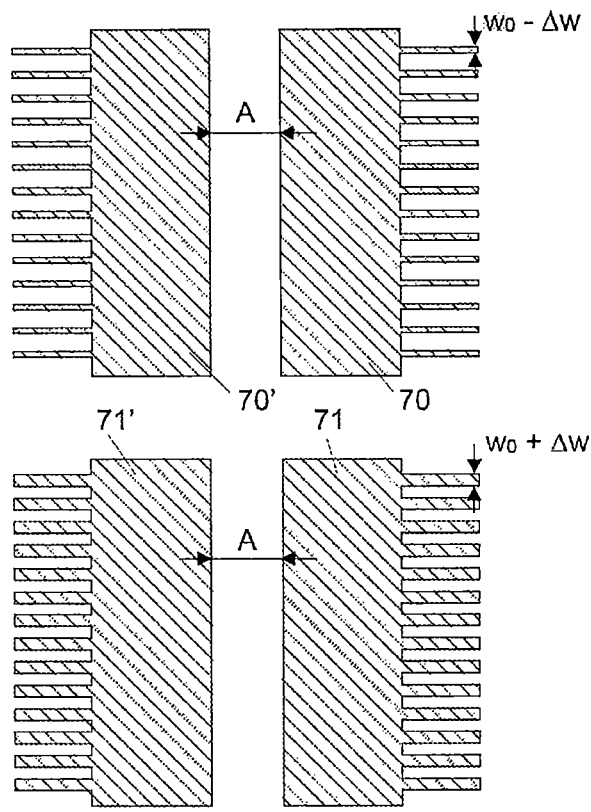
FIG. 25 illustrates an example of a target that is applicable in example methods, wherein the target comprising two different marks, according to example embodiments.

The target shown in FIG. 25 is applicable in example embodiments for characterizing pitch walk in an array of features produced by SAQP on the basis of a mandrel array with features of a nominal design width $w_0$, and nominal design pitch p. The nominal design dimensions $w_0$ and p may be used to obtain uniform periodicity in the arrays produced by SAQP on the basis of the mandrel. The target comprises a first pair of identical and symmetrically arranged marks 70 and 70' and a second pair of identical and symmetrically arranged marks 71 and 71', each having the comb-shape described above in relation to FIGS. 23 and 24. Marks 70' and 71' are the mirror images of the marks 70 and 71 about an axis that is parallel to the direction of the arrays of line features (i.e. the direction perpendicular to the line features themselves). The first pair of marks 70/70' are designed to produce a mandrel array with pitch p and features that have a width of $w_0-\Delta w$ with $\Delta w$ a given value. The second pair of marks 71/71' are designed to produce a mandrel array with pitch p and features that have a width of $w_0+\Delta w$. For example, when $w_0$ is equal to 48 nm and p equal to 128 nm, as in the example described in the introduction, $\Delta w$ may be 16 nm, i.e. the first mark 70 is designed to produce a mandrel array with 32 nm features at 128 nm pitch and the second mark 71 is designed to produce a mandrel array with 64 nm features also at 128 nm pitch. The asymmetric versions 70 and 70' on the one hand and 71 and 71' on the other, are designed to be placed with respect to each other at a distance A which is the same for the pair 70/70' as for the pair 71/71'.

Figure 26:
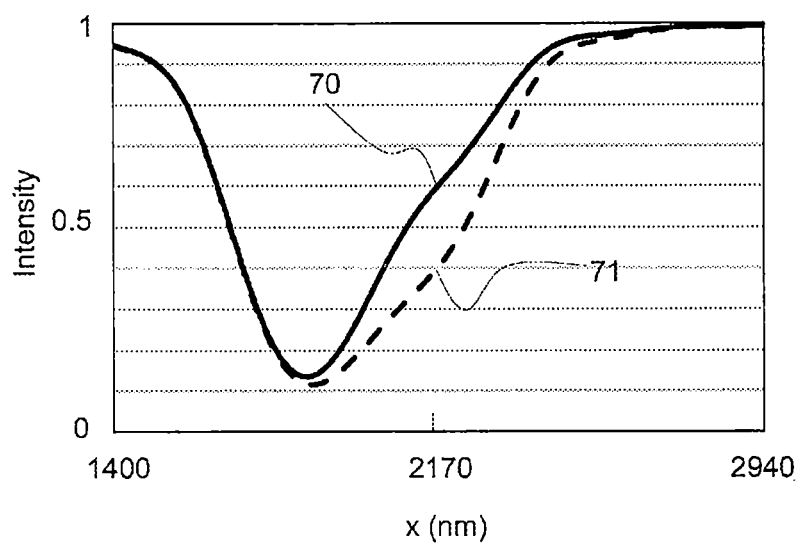
FIG. 26 illustrates the different intensity profiles in images of mandrel structures obtained via the marks of the pattern shown in FIG. 25, according to example embodiments.

FIG. 26 shows the simulated intensity profiles, equally numbered 70 and 71, of the two printed and etched mandrel structures obtained from the marks 70 and 71, obtainable through the use of optical metrology tool as described above, in the case of w=48 nm and $\Delta w$=16 nm. The background intensity is normalized to a value of 1 at maximum intensity (i.e. outside of the mandrel structure) and patterned regions reduce the image intensity relative to the background. It is seen that the position corresponding to an intensity of 0.5 shifts as a function of the $\Delta w$ value. This means that the centroid position of the printed and etched mandrel structures is sensitive to the design width shift $\Delta w$.

FIGS. 27 and 28 show details of the structures obtained after SA1 and SA2, as well as the corresponding intensity profiles. In both cases, it is seen that the image intensity centroid of the serpentine structure image (in simulated structures, this corresponds to the minimum 26 in FIG. 24) shifts in the x-direction as a function of $\Delta w$. This is a consequence of the inherent asymmetry introduced between the left-hand side 75 and right-hand side 76 of the serpentines when $\Delta w \ne 0$, as illustrated in the details of the line-end loops shown in FIGS. 27 and 28. The detection and measurement of these centroid shifts allows to detect pitch walking errors on the basis of the target of FIG. 25.

Figure 29A:
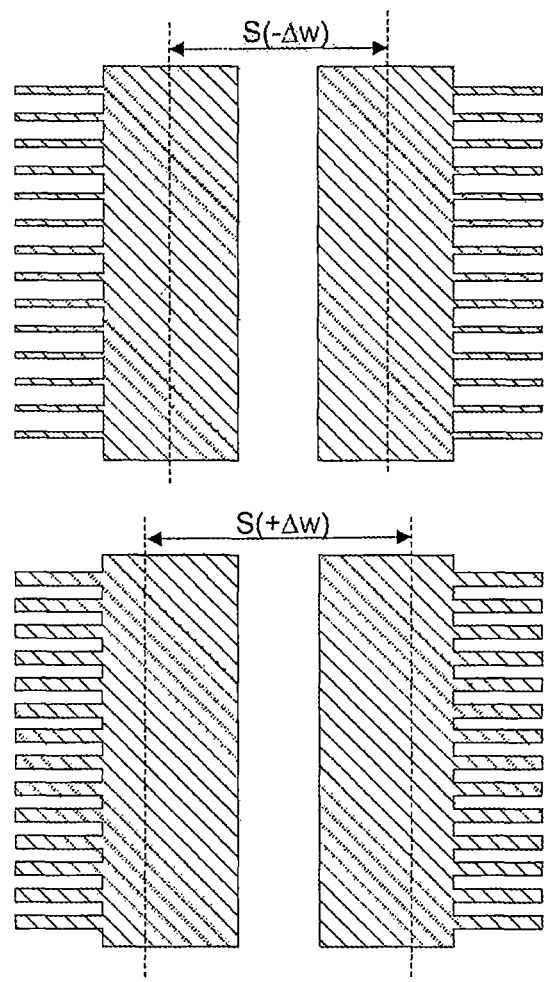
FIG. 29A illustrates the position-related parameters obtained from structures produced by lithography and/or etch on the basis of the marks in the target of FIG. 25, according to example embodiments.
Figure 29B:
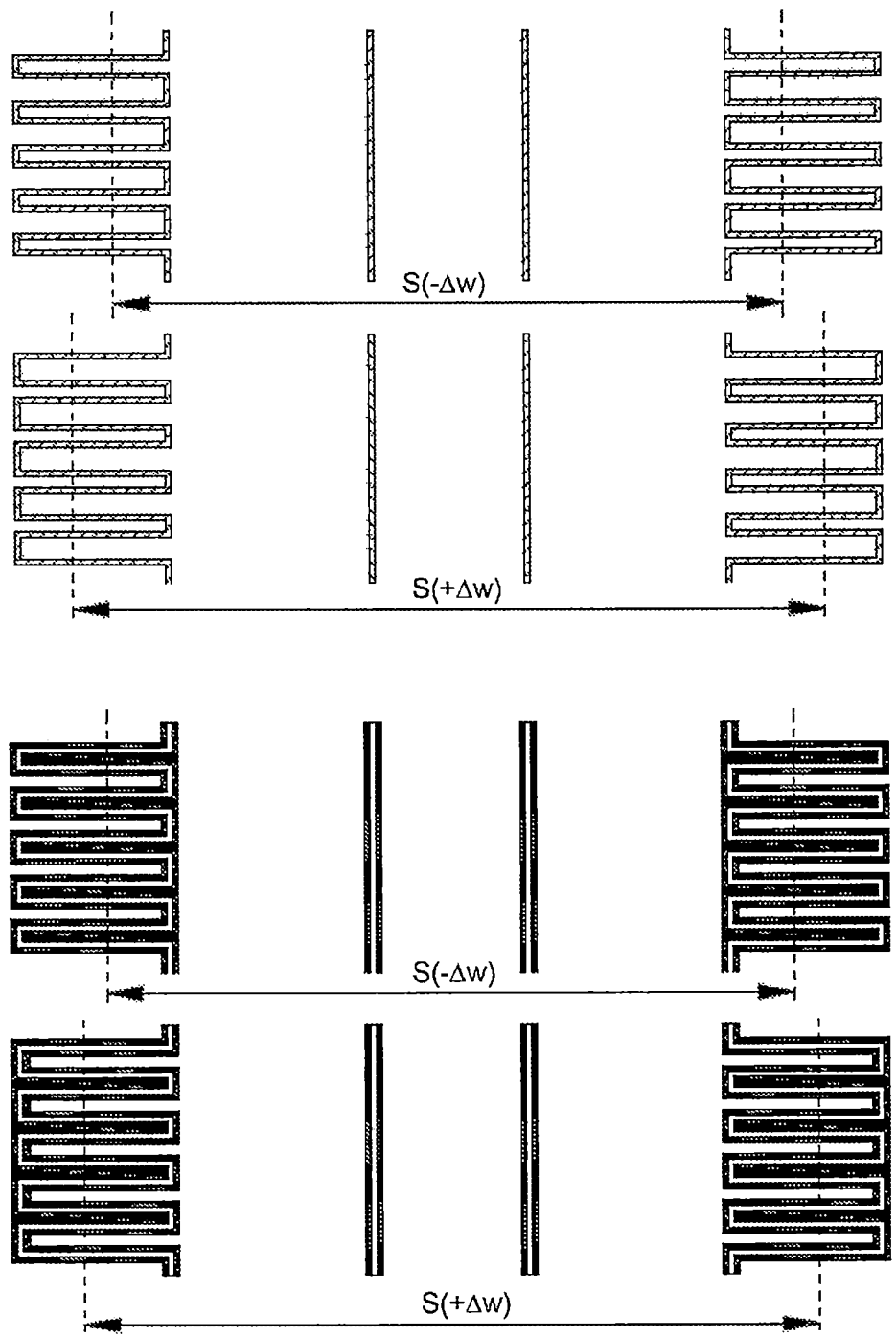
FIG. 29B illustrates the position-related parameters obtained from structures produced by self-aligned patterning on the basis of the marks in the target of FIG. 25, according to example embodiments.

When the structures in the target of FIG. 25 are produced by lithography and etch, followed by SA1 and SA2, the shifts of the centroids of the comb structures of FIG. 25 and the serpentine structures of FIG. 29 can be measured in an IBO tool, which is well-equipped for measuring the distance between two structures in the field of view of the tool. In particular, the distances $S(+\Delta w)$ and $S(-\Delta w)$ are measured, as illustrated in FIG. 29A, which illustrates the parameters $S(+\Delta w)$ and $S(-\Delta w)$ after lithography and/or etch of the mandrel structures, and in FIG. 29B after SA1 (upper two images) and SA2 (lower two images). In FIG. 29A, $S(-\Delta w)$ is the distance between the centroids of the pair of mandrel structures 70/70' (feature design width $w_0-\Delta w$), and $S(+\Delta w)$ is the distance between the centroids of the pair of mandrel structures 71/71' (feature design width $w_0+\Delta w$). In FIG. 29B, $S(-\Delta w)$ is the distance between the centroids of the serpentine structures generated from the symmetrically arranged mandrels 70/70' (feature design width $w_0-\Delta w$), $S(+\Delta w)$ is the distance between the centroids of the serpentine structures generated from the symmetrically arranged mandrels 71/71' (feature design width $w_0+\Delta w$). The previous paragraph thus defines the parameter S in this particular embodiment.

$S(-\Delta w)$ and $S(+\Delta w)$ are subsequently compared to a reference value $S_{0ref}$ (a different reference value is to be taken into account at each patterning step; e.g. mandrel lithography, mandrel etch, SA1 and SA2) that represents the process operation point, which is essentially the condition of "no pitch walk error". The reference value may be determined by a calibration process performed on the lithographic mask that is to be used in example methods, i.e. a mask that includes one or more targets in accordance with FIG. 25 (or other suitable designs as described further in this text). The mask may further comprise patterns for producing semiconductor device features which are to be manufactured on a chip. Some of these patterns are mandrel patterns for producing arrays of device features associated with the target. This means that the mandrel patterns are designed to produce mandrel structures characterized by a pitch that is equal or similar to the nominal pitch p and by a feature width that is equal or similar to the nominal width $w_0$. The associated feature arrays are produced on the basis of the mandrel structures by the same self-aligned multiple patterning steps for which the target is designed (for example SA1 and SA2 in the case of SAQP). The associated device arrays may be located in the vicinity of a target designed for p and $w_0$ (e.g. the target of FIG. 25).

Figure 30:
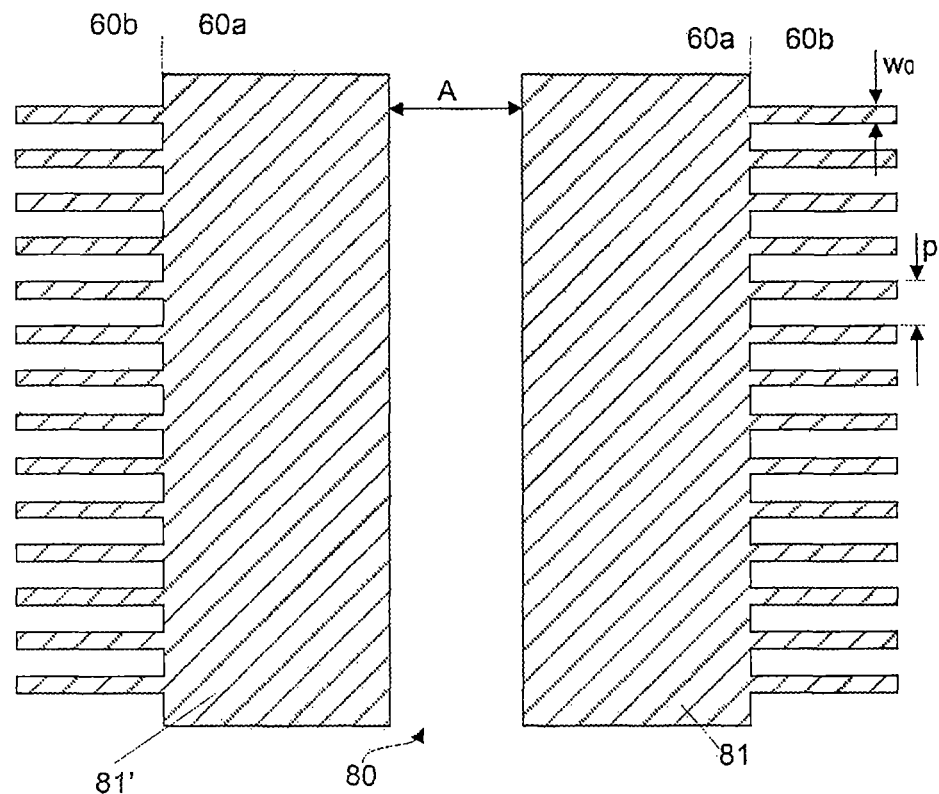
FIG. 30 illustrates a target applicable in a calibration procedure for determining a reference value of the position-related parameter, according to example embodiments.

When the target of FIG. 25 is used, one of the mandrel patterns for producing associated feature arrays is itself a metrology target 80 shown in FIG. 30. The target 80 may be located in the vicinity of the target of FIG. 25 and may be included in the target, thereby resulting in the target of FIG. 4. The target 80 comprises a pair of comb-shaped marks 81/81' designed for pitch p and feature width $w_0$, having the same dimensions of the uniform and periodic portions 60a and 61b as the marks in FIG. 25, and designed to be placed at the same mutual distance A as the marks in FIG. 25.

In the calibration process, the mask patterns (device patterns and targets) are printed, etched and processed by self-aligned multiple patterning on one or more test wafers through a range of processing parameters. The processing parameters which are modulated through a particular range may include the dose and focus of the lithography process for printing the first mandrel structures, and the etch parameters applied in the etching process of the first mandrels, as well as process parameters applied in the self-aligned patterning steps. The focus-parameter is the deviation from a pre-defined zero-defocus setting on the exposure tool, expressed for example in nm. Dose is defined as the energy applied through the mask during exposure, expressed for example in mJ/cm$^2$. Both focus and dose are values that can be set on the lithography tool. Etch process parameters that may be modulated are: etch time, etch rate, voltage, chamber pressure, etc. SA1 and SA2 spacer deposition parameters may also be modulated as part of the optimization matrix.

The calibration procedure includes printing and etching the target patterns and the associated mandrel patterns multiple times on one or more test wafers, followed by the SA1 and SA2 process steps, each time applying different process parameters, incrementing for example the mandrel etch time in fixed steps while the SA depositions remain constant and vice versa. To determine the optimized process operating point, the associated device patterns produced by SAxP are measured by high resolution measurement techniques such as SEM (scanning electron microscopy), AFM (atomic force microscopy) or TEM (transmission electron microscopy), and the optical targets are measured on an IBO tool, including at least the measurement of the S-value on the target 80, i.e. the distance between the centroids of the two marks of target 80. The S value is measured after each step of the process: lithography, etch, SA1, SA2, etc.

The calibration procedure results in a "golden standard", which is a set of process conditions determined on the basis of the criterion of essentially no pitch walk errors occurring in one or more of the associated device feature arrays obtained after completion of the self-aligned patterning steps (SA1, SA2, etc.). At these process conditions, the S values determined on the target 80 after lithography, after etch, after SA1, after SA2, etc., are taken as respective reference $S_{0ref}$ values.

Returning to the target of FIG. 25, the values $S(+\Delta w)$ and $S(-\Delta w)$ obtained after lithography, etch, SA1 and SA2 during a manufacturing process, are compared to their corresponding reference values $S_{0ref}$ by calculating a value $\delta S$ defined as:

$$\delta S = \frac{S(+\Delta w) + S(-\Delta w)}{2} - S_{0ref} \quad (34)$$

This is an alternative way of calculating $\delta S$ appearing in equation (4), when $S_0$ is not explicitly measured on a mark pair as shown in FIG. 30, i.e. designed for $w=w_0$. Based on the linear relation between S and w, $S_0$ may indeed be written as:

$$S_0 = \frac{S(+\Delta w) + S(-\Delta w)}{2}$$

When the structures based on the target of FIG. 25 have been produced under conditions which do not result in a pitch walk error or very low pitch walk error, $\delta S$ equals zero or essentially zero. Therefore, the monitoring of $\delta S$ allows to monitor the occurrence of pitch walk errors during a fabrication process. According to the above-described embodiment, the $\delta S$ values after lithography, after etch, after SA1 and after SA2 are monitored. According to another embodiment, only the $\delta S$ values after one or more of the self-aligned patterning steps are monitored. According to still another embodiment, only the δS values after lithography and/or etch are monitored.

According to example embodiments, a second parameter may be derived from the target of FIG. 25. This is the parameter α defined as the rate of change of the S-values as a function of the change in the feature width w.

$$\alpha = \frac{dS}{dw} \quad (35)$$

Figure 31:
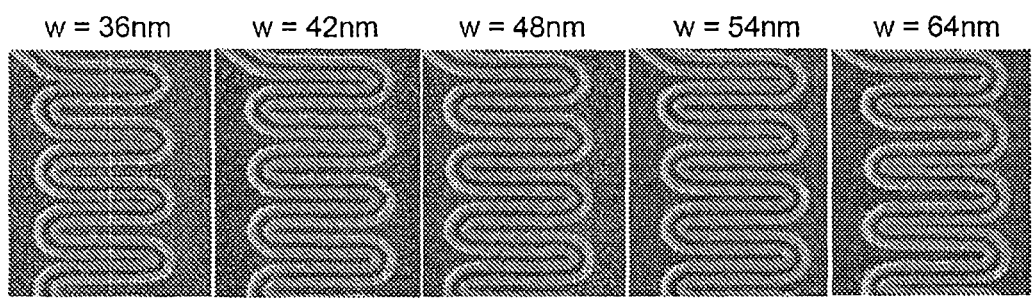
FIG. 31 illustrates SEM images of various SA2-produced serpentine-shaped structures with varying values of the feature design width w, according to example embodiments.
Figure 32:
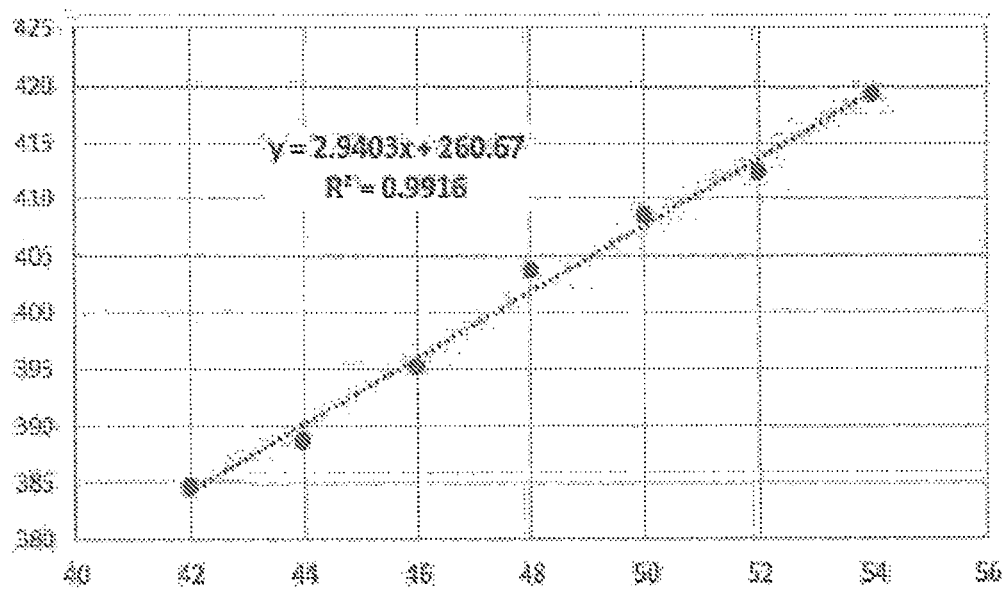
FIG. 32 illustrates a graph relating the w-values in FIG. 31 to the position-related parameters measured on the structures of FIG. 31, according to example embodiments.
Figure 33:
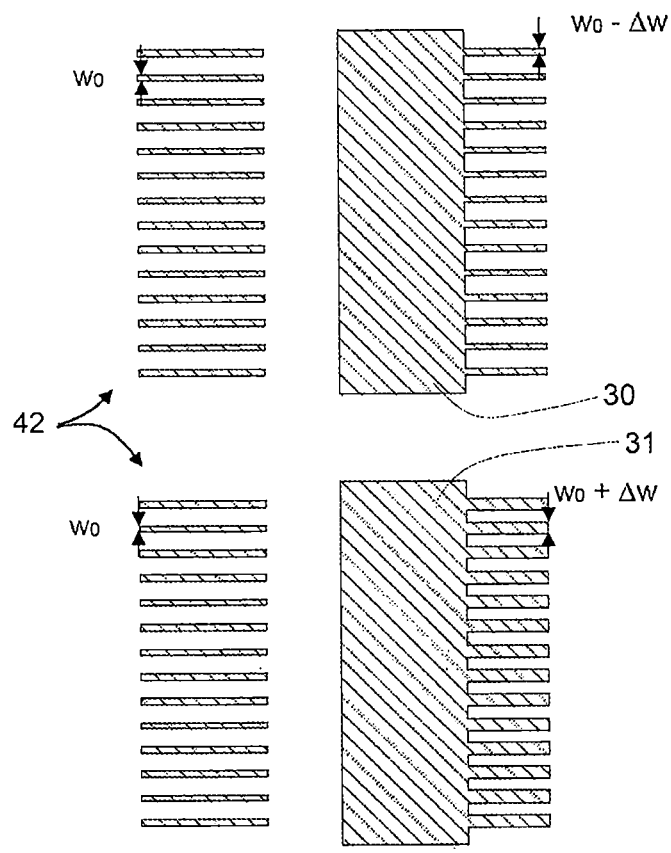
FIG. 33 illustrates an alternative target design applicable in examples methods, according to example embodiments.

In accordance with example embodiments, the relationship between the measured S parameters (after lithography, etch, SA1, SA2, etc.) and w is approximately linear in an area around the design value $w_0$ that corresponds with realistic error margins. FIG. 31 shows SEM images of a plurality of serpentine structures obtained after SA2, for a number of different values of the feature width w: 36 nm, 42 nm, 48 nm, 54 nm, 64 nm, which include a nominal value $w_0$ (48 nm in this case), and a number of values below and above the nominal value $w_0$. The graph in FIG. 32 shows the S value as a function of these w-values, and the best approximation of the data, indicating that the relation is largely linear. The parameter α can be calculated from the measurement of S(+Δw) and S(−Δw) derived from the target in FIG. 25, as follows:

$$\alpha = \frac{S(+\Delta w) - S(-\Delta w)}{2\Delta w} \quad (36)$$

Alternatively, if additional mark pairs with different design widths w are available in the target, α can be determined based on a best fit of the S-values, as described above in relation to FIG. 5 and equation (2).

As described above, α may be compared to a reference value $\alpha_0$, determined at the process operating point. In this way, α becomes a second control parameter derivable from the target of FIG. 25. During manufacturing, the value of $|\alpha - \alpha_0|$ may then be compared to a tolerance.

As described also in relation to the previous embodiments, the α-value may be used to calculate the effective shift in the design width w corresponding to the measured S variation:

$$\delta w_0 = \delta S/\alpha \quad (37)$$

This shift is to be interpreted as follows: when δS is higher than zero, it is as if the arrays produced by the lithography, etch or SAx steps are derived from a mandrel with design width $w_0+\delta w_0$. Likewise, when δS is lower than zero, it is as if the arrays are derived from a mandrel with design with $w_0-\delta w_0$. To counteract the pitch walk errors, an adjustment of the actual design width by a value of $-\delta w_0$ could be considered, i.e. a re-design of the mask. In some embodiments, however, process parameters are adjusted based on known relations between such parameters and the critical dimensions obtained by lithography, etching and self-aligned patterning. Such relations are obtained through calibration procedures which may not be described here in detail. In short, the information provided in the form of the values δS and α allow the measurements for counteracting a detected pitch walk error that exceeds an allowable level.

The method for monitoring pitch walk is not limited to the use of the target design shown in FIG. 25. The centroid shift of the asymmetric loop may end in the serpentine structures obtained from the self-aligned patterning steps, can be measured with respect to a given offset structure. This offset structure may be a symmetrically mirrored version (70',71') of the comb mark patterns 70 and 71, as in the case of FIG. 25. This technique may be used, as it provides a high sensitivity of the measured S-value, given that S changes by twice the value of a single centroid shift. Alternatively, the comb mark patterns 70 and 71 could be referenced to a symmetric offset mark pattern 72, as illustrated in the alternative design shown in FIG. 33. The symmetric mark patterns 72 are segmented in order to allow for the creation of symmetric array structures by the SAxP steps, the symmetric structures having their centroid at a fixed position at the geometrical midpoint of the arrays. The S values measured on the basis of this design allow to calculate the same parameters δS and α as described above (with $S_{0ref}$ obtainable from a calibration of the target design of FIG. 33). According to an embodiment, a target could comprise a single symmetric segmented mark 72, for example placed at the center of the target and serving also as a positioning reference. The asymmetric marks designed for $w_0-\Delta w$ and $w_0+\Delta w$ are then placed around the central mark, for example placed symmetrically on either side of the central symmetric mark, allowing the measurement of S(−Δw) and S(+Δw) in the manner described above.

According to example embodiments, the target applied in the method for monitoring pitch walk comprises not only the marks 70 and 71 designed for widths $w_0-\Delta w$ and $w_0+\Delta w$, but also the same comb mark designed for the nominal width $w_0$ and pitch p (hereafter referred to as "$w_0$" mark). In this case the target may comprise a pair of mirrored marks 81/81' designed for $w_0$ and p (as shown in FIG. 30) or a "$w_0$"— mark 81 and a symmetric offset mark 72. The target may further comprise additional versions of the comb mark with other design values of the feature width w (i.e. other values of +Δw and/or −Δw). An example of the latter is described above and shown in FIG. 6.

In another alternative, a target suitable for the method for monitoring pitch walk errors may comprise multiple sets of comb-shaped marks, each set defined by different nominal values of p and/or $w_0$ tailored to alternate SAxP process conditions.

Based on the above, example embodiments concern a method for verifying pitch walk during the manufacturing process of semiconductor structures by a self-aligned multiple patterning process. On the lithographic mask that is used for producing the mandrel structures of the SAxP arrays, one or more targets are included which define reference structures that are to be printed in the vicinity of arrays of semiconductor device features, at least some of which are associated to the targets, i.e. these device arrays are obtained by multiple patterning based on mandrel structures designed to have features widths and pitch essentially equal or similar to $w_0$ and p. Each target comprises at least two marks 70 and 71 of the type shown in FIG. 25, the two marks being configured for producing mandrel structures with pitch p and shifts −Δw and +Δw respectively, relative to a nominal feature width $w_0$, used for producing uniform SAxP periodicity.

During the manufacturing process, the values S(+Δw) and S(−Δw) are measured at one or more of the SAxP process steps, and/or after lithography and etch (or only after lithography or only after etch) of the mandrel structures, in each of the targets distributed across the printed area, and the δS-values are computed, using $S_{0ref}$ values previously determined by a calibration process. In some embodiments, also the α values are computed. The evaluation of δS derived from marks characterized by a given set of p,$w_0$,s values in a particular target, with respect to a tolerance, allows to assess the degree of pitch walk occurring in SAx-produced arrays on the wafer, which are located in the vicinity of the target. The "evaluation of δS with respect to a tolerance" entails at least the evaluation of the absolute value of δS with respect to the tolerance. As stated above, the sign of δS may then be used to derive a correction of the design width $w_0$.

When |δS| approaches or exceeds the tolerance, process parameters may be adjusted, such as the dose and focus values during lithography or parameters which influence the etch bias during etching of the mandrel-structure, in order to maintain an acceptable level of pitch walk errors across the printed area. The α value provides an additional criterion for monitoring stability of the production process and/or the metrology process (i.e. the measurement of S-values in an IBO tool), comparing a to a constant reference value $α_{ref}$ (see above).

The obtained δS and α values during manufacturing may be applied in a variety of feedback control strategies and embodiments are not limited to any particular strategy. According to one embodiment, the control is performed on a wafer-to-wafer or possibly a chip-to-chip basis:

S(+Δw) and S(−Δw) are measured on the basis of a plurality of targets distributed across one or more lithographic masks used in the manufacturing process of a chip, A plurality of δS values are calculated (e.g. after lithography, after etch, after SA1, after SA2, etc.)

the δS values are evaluated with respect to a tolerance, when δS values appear which approach or exceed the tolerance, one or more process parameters are adjusted in the production process of the next wafer or chip. This may be an adjustment of dose during the lithography process, and/or an adjustment of etch parameters during the etch process for producing the mandrel structures, or possibly an adjustment of the deposition parameters applied during the self-aligned patterning steps (SA1, SA2, etc.). As stated above, the precise adjustments used to correct the pitch walk error can be determined by the person skilled in the art of lithography/etch and SAxP processes, and may not be described here in detail.

If the same targets are used in different layers of a chip, a feedback control may be realized during the processing of a single chip: pitch walk occurring in one layer may then be compensated for in one of the following layers of the chip.

It is also possible to adjust processing parameters during the steps of the self-aligned patterning process. For example when δS, determined after SA1 is too high, the SA2 process may be adjusted. In this way, the control strategy applied is a feed-forward control.

Example methods may also be applied in patterning steps performed in the production of a lithographic mask as such. For example, an EUV mask is produced on an EUV blank by patterning an absorber layer on the blank. By including one or more metrology targets in accordance with example embodiments, the critical dimensions of the features as reproduced on the absorber layer may be monitored.

Example methods are not only applicable to processes involving a lithographic mask, but it is applicable to any process step wherein a pattern of features is reproduced on a substrate, according to a predefined pattern. This includes steps applying the techniques known as "maskless lithography" or "direct writing". What counts is that at least one target comprising one or more asymmetric mark as described above is included in the predefined pattern, so that the marks are reproduced on a substrate as mark patterns, from which δS can be determined.

The method is also not limited to process steps involving a device layout in a chip manufacturing process, but it is also applicable to processes which do not directly result in a micro-electronic device, for example to the printing of test patterns used for patterning tool or process qualification.

According to example embodiments, when $δw_0$ and/or δCD (in x and/or in y direction) approaches or exceeds a given tolerance, process parameters may be adjusted, such as the dose and focus values during lithography or one or more etching parameters, in order to counteract the deviation from the design width $w_0$. Depending on the precise definition of the S-parameter, the sign of $δw_0$ or δCD indicates whether certain parameters should be increased or decreased for counteracting the deviation from the design width. The α and β values provide an additional criterion for monitoring stability of the production process and/or the metrology process.

The obtained $δw_0$, δCD, α, and β values may be applied in a variety of feedback control strategies and embodiments are not limited to any particular strategy. According to one embodiment, the control is performed on a chip-to-chip basis, described hereafter for the evaluation based on $δw_0$, determined from targets comprising optical marks (IBO e.g.) but valid also for evaluations based on DBO and/or δCD, α or β:

$δw_0$ is measured on the basis of a plurality of targets distributed across one or more lithographic masks used in the manufacturing process of a chip, the $δw_0$ values are evaluated with respect to a tolerance, when $δw_0$ values appear which approach or exceed the tolerance, one or more process parameters are adjusted in the production process of the next chip. This may be an adjustment of focus and dose during the lithography process, and/or an adjustment of etch parameters during the etch process. The precise adjustments used to correct the error can be determined by the person skilled in the art of lithography/etch processes, and may not be described here in detail.

If the same targets are used in different layers of a chip, a feedback control may be realized during the processing of a single chip: deviations from $w_0$ in one layer may then be corrected in one of the following layers of the chip.

Embodiments are equally related to a computer-implemented monitoring unit configured to be integrated in an apparatus for semiconductor processing including lithography and etching steps, the apparatus further comprising an optical metrology tool, for example an image based or diffraction based overlay tool. The monitoring unit is basically a computer configured to execute the method steps as set out in any of the appended claims.

According to example embodiments, the monitoring unit comprises a memory provided with a computer program for executing the method steps, when the program is run on the monitoring unit. Embodiments are equally related to a software product configured to execute the above method steps, when the program is run on the monitoring unit.

The monitoring unit may be configured to calculate—on the basis of the results of the assessment—updated processing parameters of one or more processes performed by the semiconductor processing apparatus, and feedback the updated parameters to the apparatus.

While embodiments have been illustrated and described in detail in the drawings and foregoing description, such illustration and description are to be considered illustrative and not restrictive. Other variations to the disclosed embodiments can be understood and effected by those skilled in the art in practicing the claims, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used. Any reference signs in the claims should not be construed as limiting the scope.

What is claimed is:

1. A method for monitoring critical dimensions of 1-dimensional features or 2-dimensional features arranged in a pattern and produced on a substrate by a process step that is part of or related to a manufacturing process for producing a semiconductor device,
    wherein the process step is performed in accordance with a predefined pattern design,
    wherein one or more metrology targets are added to the predefined pattern design,
    wherein each metrology target comprises one or more marks of an asymmetric design,
    wherein each mark of the asymmetric design comprises a uniform portion of width K and a periodic portion of width L arranged adjacently in a given direction,
    wherein the periodic portion comprises 1-dimensional features or 2-dimensional features arranged in a regular array,
    wherein the periodic portion comprises an array of 1-dimensional features or 2-dimensional features at a design pitch,
    wherein the design dimension of the 1-dimensional features or one of the design dimensions of the 2-dimensional features is equal to or situated in a range around a nominal value $w_0$, and
    wherein the method comprises each of the following steps performed in relation to each of the one or more metrology targets:
        performing the process step, thereby obtaining one or more asymmetric mark patterns corresponding respectively to the one or more marks of the asymmetric design;
        defining a parameter S representative of a position of a centroid of the one or more asymmetric mark patterns, wherein the parameter S changes essentially linearly as a function of at least one of the design dimensions of the 1-dimensional or 2-dimensional features;
        determining, from the one or more asymmetric mark patterns, a shift $\delta S$ of the parameter S for an asymmetric mark having features of design dimension $w_0$ with respect to a reference value for the parameter S, wherein the reference value is valid at a previously defined process operating point for the process step; and
        assessing, based on the shift $\delta S$, a critical dimension of 1-dimensional or 2-dimensional features of the one or more asymmetric mark patterns produced by the process step.

2. The method according to claim 1, wherein the method further comprises, for each metrology target:
    determining a proportionality factor $\alpha$;
    calculating $\delta w_0 = \delta S/\alpha$; and
    evaluating $\delta w_0$ with respect to a tolerance.

3. The method according to claim 2, further comprising evaluating $|\alpha - \alpha_0|$ with respect to a tolerance, wherein $\alpha_0$ is a value of the proportionality factor $\alpha$ at the process operating point.

4. The method according to claim 2,
    wherein one or more of the metrology targets comprise asymmetric marks configured so that the position of the centroid of the one or more asymmetric mark patterns is detectable by an optical tool, such that the parameter S can be measured using the optical tool,
    wherein the one or more metrology targets comprise a plurality of the asymmetric marks, having the one or more design dimensions in a range around the nominal value,
    wherein, for each of the one or more metrology targets, the proportionality factor $\alpha$ is determined by fitting a linear function to measured values of the parameter S for the plurality of the asymmetric marks,
    wherein, for each of the one or more metrology targets, $\delta S$ is determined as $S_0 - S_{0ref}$,
    wherein $S_0$ is a parameter value for a mark pattern of a mark having features of design dimension in a range around the nominal value, and
    wherein $S_{0ref}$ is the reference value for the parameter S at the process operating point.

5. The method according to claim 2,
    wherein the one or more asymmetric marks are arranged in each of the one or more metrology targets as mirrored pairs of identical marks,
    wherein the mirrored pairs of identical marks are mirrored about a line perpendicular to a direction in which the uniform portion and the periodic portion are arranged, and
    wherein the parameter S is a function of a distance D between the centroids of the two mirrored mark patterns representative of the two mirrored marks.

6. The method according to claim 2,
    wherein the one or more asymmetric marks are arranged in each of the one or more metrology targets with respect to one or more symmetric marks, and
    wherein the parameter S is a function of a distance D between the centroid of the asymmetric mark patterns representative of or derived from the one or more asymmetric marks and the centroid of a symmetric mark pattern or patterns representative of the one or more symmetric marks.

7. The method according to claim 6,
    wherein the position parameter S is equal to $D - D_s$,
    wherein $D_s$ is a design value of a distance between geometric midpoints of two mirrored marks, and
    wherein $D_s$ is a constant for each of the design dimensions and for the given direction.

8. The method according to claim 2,
    wherein one or more of the metrology targets comprises at least a first set of diffraction gratings and a second set of diffraction gratings,
    wherein each set of diffraction gratings comprises two grating marks arranged adjacently in the same direction and in a repeated manner,
    wherein at least one of the grating marks in each set is one of the asymmetric marks,
    wherein the asymmetric mark of the first grating set comprises features of design dimension $w_0 - \Delta w_0$,
    wherein $\Delta w_0$ is a predefined offset value,
    wherein the asymmetric mark of the second grating set comprises features of design dimension $w_0 + \Delta w_0$, wherein δS and α are calculated from a first equation and a second equation, wherein the first equation is $\alpha = (\Delta I_1 - \Delta I_2)/2\kappa\Delta w_0$, wherein the second equation is $\delta S = (\Delta I_1 + \Delta I_2)/2\kappa$, wherein $\Delta I_1$ and $\Delta I_2$ are differences between a plus and a minus first order diffracted intensity measured on a first set of mark features and a second set of mark features obtained by a lithography step or an etch step, based on the first grating set and second grating set, and wherein κ is a diffraction factor.

9. The method according to claim 8, wherein κ is calculated from a measurement of the plus and the minus diffraction intensities of an additional set of two gratings located within or in a vicinity of the pattern design, wherein each grating set comprises two marks arranged adjacently and in a repeated manner, wherein at least one of the two marks arranged adjacently comprises an asymmetric mark, wherein a distance between the two adjacent marks is different in the first grating compared to the second grating, and wherein the difference between the distances in the first grating and the second grating is pre-defined.

10. The method according to claim 2, further comprising, for each metrology target and for at least one of the dimensions:

calculating, from the shift δS, a shift δCD of a critical dimension CD of features of the nominal design dimension $w_0$, with respect to a value of a critical dimension $CD_p$ at the process operating point, wherein the shift δCD of the critical dimension CD is calculated as $\beta\delta w_0$, and wherein β is a proportionality factor that expresses a linear relation between the critical dimension CD and the design dimension of the features; and evaluating the shift δCD of the critical dimension CD with respect to a tolerance.

11. The method according to claim 10, wherein the proportionality factor β is calculated as (α/G), wherein G is proportional to L/p, and wherein L is a width in a direction of asymmetry of the periodic portion of the mark pattern or patterns and p is a nominal pitch of line features of the periodic portion.

12. The method according to claim 10, further comprising the step of evaluating |β−1| with respect to a tolerance.

13. The method according to claim 1, wherein the one or more asymmetric marks in at least one of the metrology targets are comb-shaped marks, and wherein the periodic portion comprises an array of parallel features extending in the given direction in which the uniform portion and the periodic portion are arranged.

14. The method according to claim 1, wherein the one or more asymmetric marks in at least one of the metrology targets are rail-shaped marks, and wherein the periodic portion comprises an array of parallel features extending in a direction perpendicular to the given direction in which the uniform portion and the periodic portion are arranged.

15. The method according to claim 1, wherein at least one of the metrology targets comprises a first group of asymmetric marks, of which the uniform portion and the periodic portion are arranged in a first direction, and a second group of the same asymmetric marks, of which the uniform portion and the periodic portion are arranged in a second direction perpendicular to the first direction, and wherein the shift δS is determined for each of the first direction and the second direction.

16. The method according to claim 15, wherein one or more of the metrology targets comprises asymmetric marks configured so that the position of the centroid of the asymmetric mark patterns is detectable by an optical tool, such that the parameter S can be measured using the optical tool, and wherein the asymmetric marks are arranged in crossshapes, each cross comprising four identical asymmetric marks.

17. The method according to claim 15, wherein the at least one metrology target comprises at least one first area and at least one second area, and wherein the asymmetric marks in the second area are mirrored with respect to the asymmetric marks in the first area.

18. The method according to claim 1, wherein the process step is a lithography step using a lithographic mask or an etch step following the lithography step, and wherein the one or more metrology targets are included in the lithographic mask.

19. A method for monitoring critical dimensions of 1-dimensional features or 2-dimensional features arranged in a pattern and produced on a substrate by an initial process step that is part of or related to a manufacturing process for producing a semiconductor device, wherein the initial process step is performed in accordance with a predefined pattern design, wherein one or more metrology targets are added to the pattern design, wherein each metrology target comprises one or more marks of an asymmetric design, wherein each mark of the asymmetric design comprises a uniform portion of width K and a periodic portion of width L arranged adjacently in a given direction, wherein the periodic portion comprises 1-dimensional or 2-dimensional features arranged in a regular array, wherein the periodic portion comprises an array of 1-dimensional features or 2-dimensional features at a design pitch, wherein the design dimension of the 1-dimensional features or one of the design dimensions of the 2-dimensional features is equal to or situated in a range around a nominal value $w_0$, wherein the method comprises additional process steps after the initial process step, thereby obtaining one or more asymmetric mark patterns not directly corresponding to the one or more asymmetric marks but derived from the one or more asymmetric marks, and wherein the method comprises each of the following steps performed in relation to each of the one or more metrology targets:

performing the initial process step, thereby obtaining one or more asymmetric mark patterns corresponding respectively to the one or more marks of the asymmetric design;

defining a parameter S representative of a position of a centroid of the one or more asymmetric mark patterns, wherein the parameter S changes essentially linearly as a function of at least one of the design dimensions of the 1-dimensional or 2-dimensional features;

determining, from the one or more asymmetric mark patterns, a shift δS of the parameter S for an asymmetric mark having features of design dimension $w_0$ with respect to a reference value for the parameter S, wherein the reference value is valid at a previously defined process operating point for the initial process step; and assessing, based on the shift δS, a critical dimension of 1-dimensional or 2-dimensional features of the one or more asymmetric mark patterns produced by the initial process step.

20. A computer-implemented monitoring unit configured to be integrated in an apparatus for semiconductor processing including lithography and etching steps, wherein the apparatus comprises a metrology tool, wherein the monitoring unit is configured to execute the steps of a method for monitoring critical dimensions of 1-dimensional features or 2-dimensional features arranged in a pattern and produced on a substrate by a process step that is part of or related to a manufacturing process for producing a semiconductor device, wherein the process step is performed in accordance with a predefined pattern design, wherein one or more metrology targets are added to the predefined pattern design, wherein each metrology target comprises one or more marks of an asymmetric design, wherein each mark of the asymmetric design comprises a uniform portion of width K and a periodic portion of width L arranged adjacently in a given direction, wherein the periodic portion comprises 1-dimensional features or 2-dimensional features arranged in a regular array, wherein the periodic portion comprises an array of 1-dimensional features or 2-dimensional features at a design pitch, wherein the design dimension of the 1-dimensional features or one of the design dimensions of the 2-dimensional features is equal to or situated in a range around a nominal value $w_0$, and wherein the method comprises each of the following steps performed in relation to each of the one or more metrology targets:

performing the process step, thereby obtaining one or more asymmetric mark patterns corresponding respectively to the one or more marks of the asymmetric design;

defining a parameter S representative of a position of a centroid of the one or more asymmetric mark patterns, wherein the parameter S changes essentially linearly as a function of at least one of the design dimensions of the 1-dimensional or 2-dimensional features;

determining, from the one or more asymmetric mark patterns, a shift δS of the parameter S for an asymmetric mark having features of design dimension $w_0$ with respect to a reference value for the parameter S, wherein the reference value is valid at a previously defined process operating point for the process step; and assessing, on the basis of the shift δS, a critical dimension of 1-dimensional or 2-dimensional features of the one or more asymmetric mark patterns produced by the process step.

* * * * *